United States Patent
Susuki et al.

(10) Patent No.: US 10,141,331 B1
(45) Date of Patent: Nov. 27, 2018

(54) THREE-DIMENSIONAL MEMORY DEVICE CONTAINING SUPPORT PILLARS UNDERNEATH A RETRO-STEPPED DIELECTRIC MATERIAL AND METHOD OF MAKING THEREOF

(71) Applicant: SANDISK TECHNOLOGIES LLC, Plano, TX (US)

(72) Inventors: Hiromasa Susuki, Yokkaichi (JP); Masanori Tsutsumi, Yokkaichi (JP); Shigehisa Inoue, Yokkaichi (JP); Junji Oh, Yokkaichi (JP); Kensuke Yamaguchi, Yokkaichi (JP); Seiji Shimabukuro, Yokkaichi (JP); Yuji Fukano, Yokkaichi (JP); Ryoichi Ehara, Yokkaichi (JP); Youko Furihata, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/607,583

(22) Filed: May 29, 2017

(51) Int. Cl.
| | | |
|---|---|---|
| *H01L 29/76* | (2006.01) |
| *H01L 27/11582* | (2017.01) |
| *H01L 27/11524* | (2017.01) |
| *H01L 27/11556* | (2017.01) |
| *H01L 27/1157* | (2017.01) |

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
CPC . H01L 51/56; H01L 51/5056; H01L 51/0072; H01L 51/5072; C09K 11/06
USPC .......................................................... 257/314
See application file for complete search history.

(56) References Cited

U.S. PATENT DOCUMENTS

| | | | |
|---|---|---|---|
| 5,915,167 A | 6/1999 | Leedy | |
| 9,412,749 B1 | 8/2016 | Shimabukuro et al. | |
| 9,576,967 B1 | 2/2017 | Kimura et al. | |
| 9,659,956 B1 | 5/2017 | Pachamuthu et al. | |
| 2010/0133598 A1* | 6/2010 | Chae ................ | H01L 27/11551 257/314 |
| 2016/0141294 A1* | 5/2016 | Peri ................... | H01L 21/28512 257/324 |
| 2016/0322381 A1* | 11/2016 | Liu .................... | H01L 27/11573 |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Andy Huynh
(74) *Attorney, Agent, or Firm* — The Marbury Law Group PLLC

(57) ABSTRACT

A three-dimensional memory device includes an alternating stack of insulating layers and electrically conductive layers located over a substrate, the alternating stack containing a memory array region and a terrace region. Memory stack structures containing a memory film and a vertical semiconductor channel extend through the memory array region of the alternating stack. Support pillar structures extending through the terrace region of the alternating stack. The support pillar structures have different heights from each other.

22 Claims, 27 Drawing Sheets

(56) References Cited

U.S. PATENT DOCUMENTS

2016/0329341 A1    11/2016   Shimabukuro et al.

OTHER PUBLICATIONS

U.S. Appl. No. 15/243,260, filed Aug. 22, 2016, SanDisk Technologies LLC.
U.S. Appl. No. 15/296,380, filed Oct. 18, 2016, SanDisk Technologies LLC.
U.S. Appl. No. 15/335,850, filed Oct. 27, 2016, SanDisk Technologies LLC.
U.S. Appl. No. 15/347,101, filed Nov. 9, 2016, SanDisk Technologies LLC.
U.S. Appl. No. 15/411,126, filed Jan. 20, 2017, SanDisk Technologies LLC.

* cited by examiner

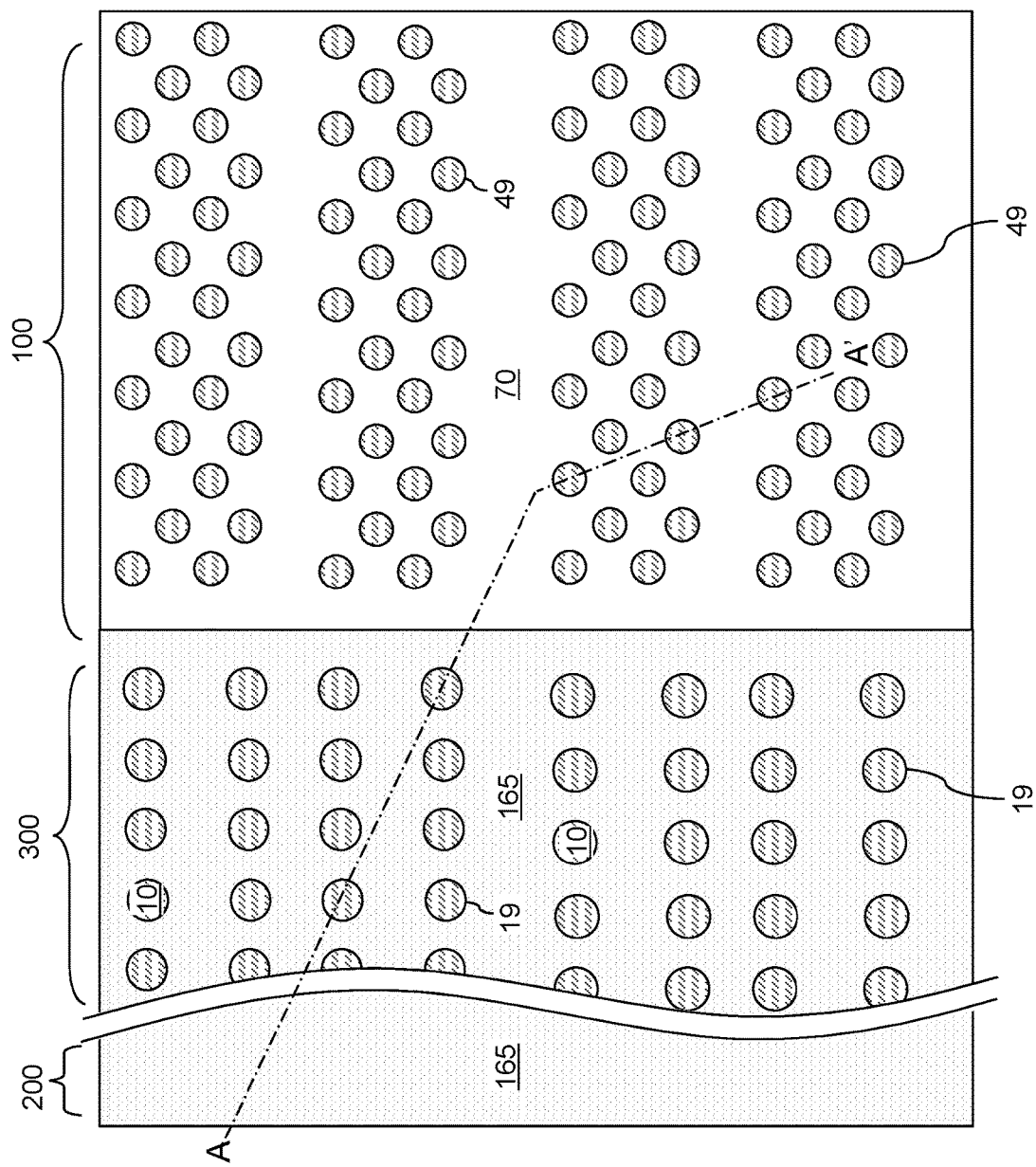

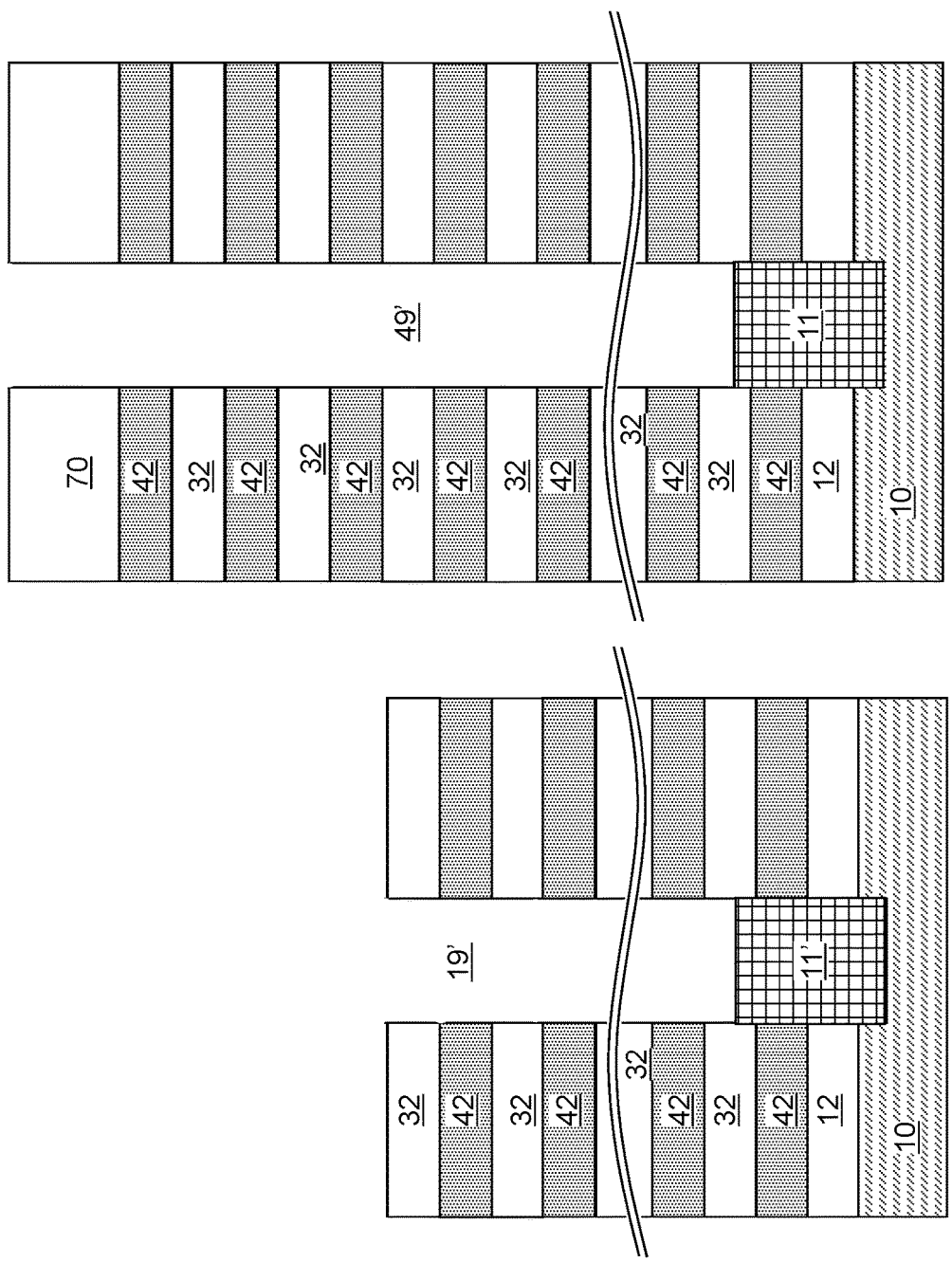

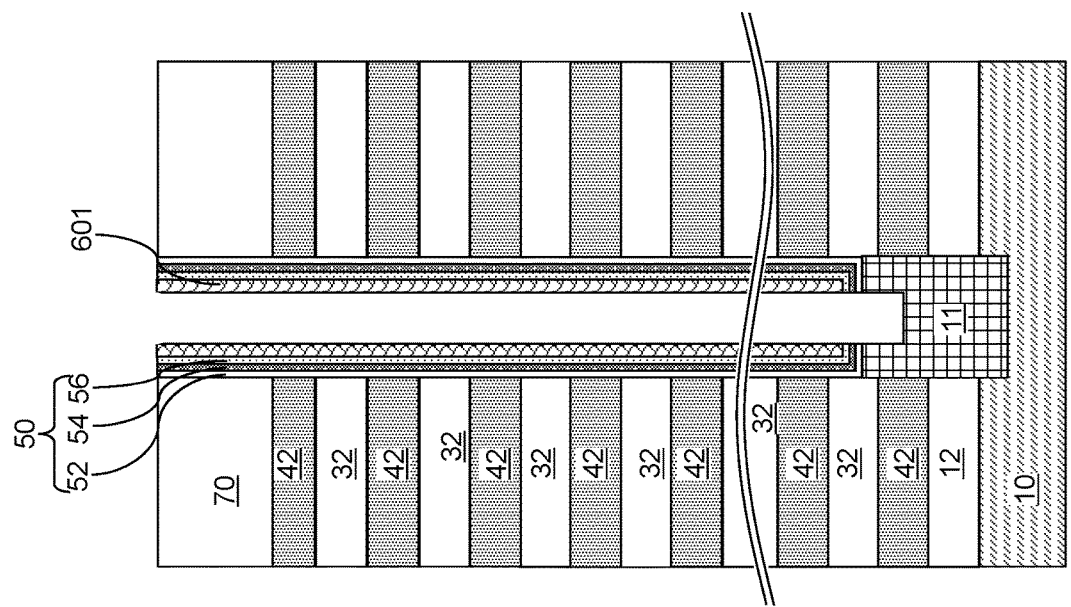
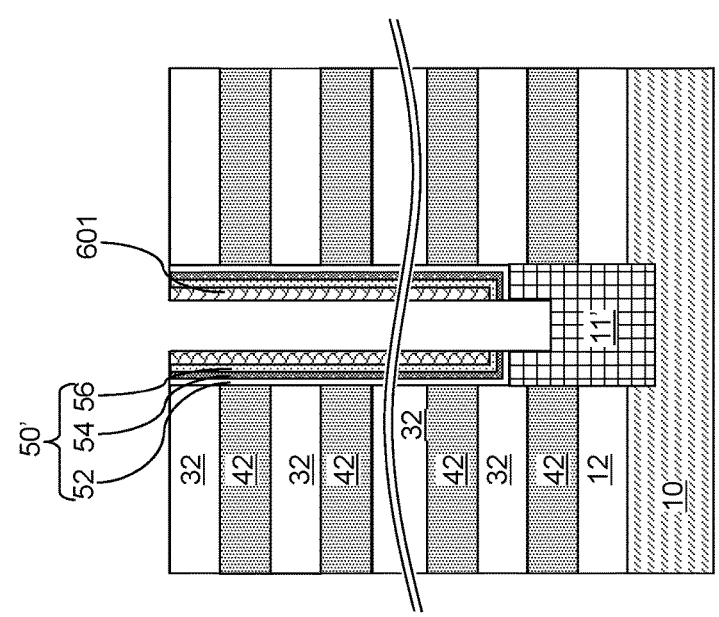

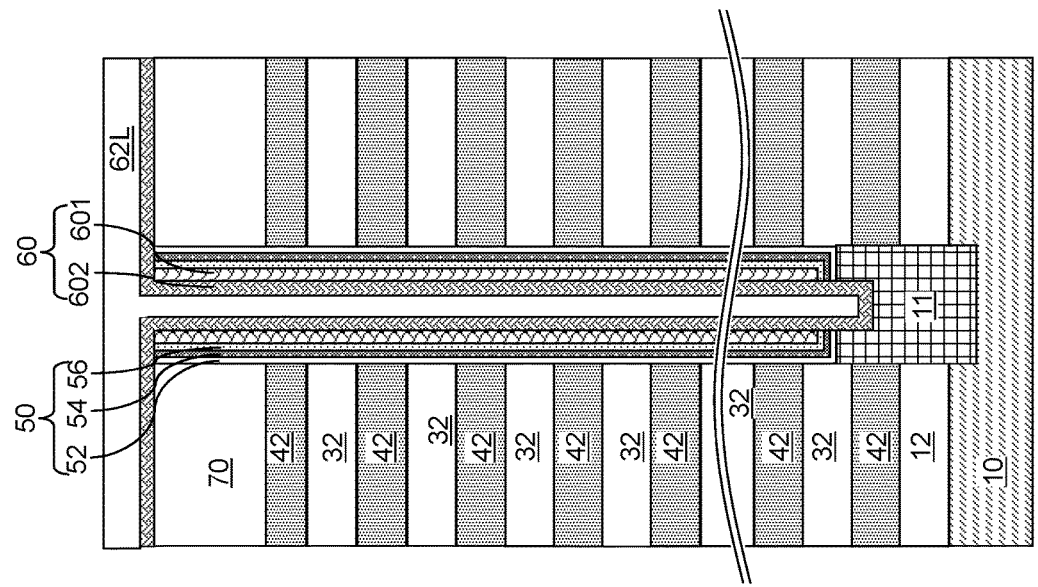
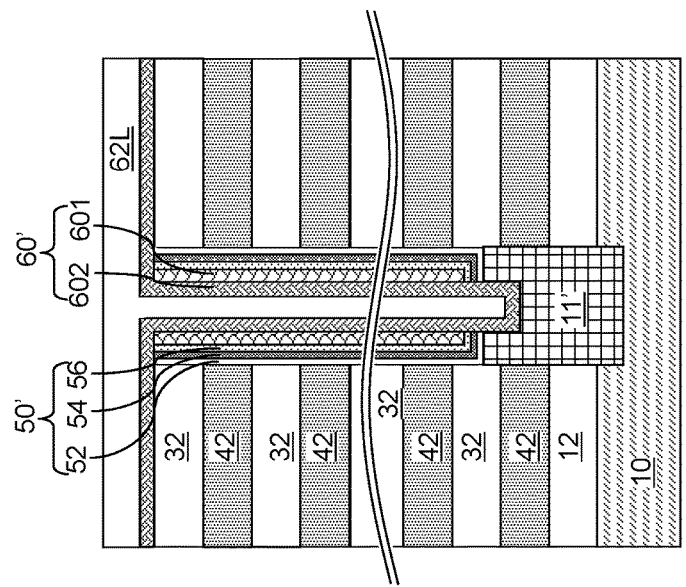
FIG. 11E
FIG. 10E

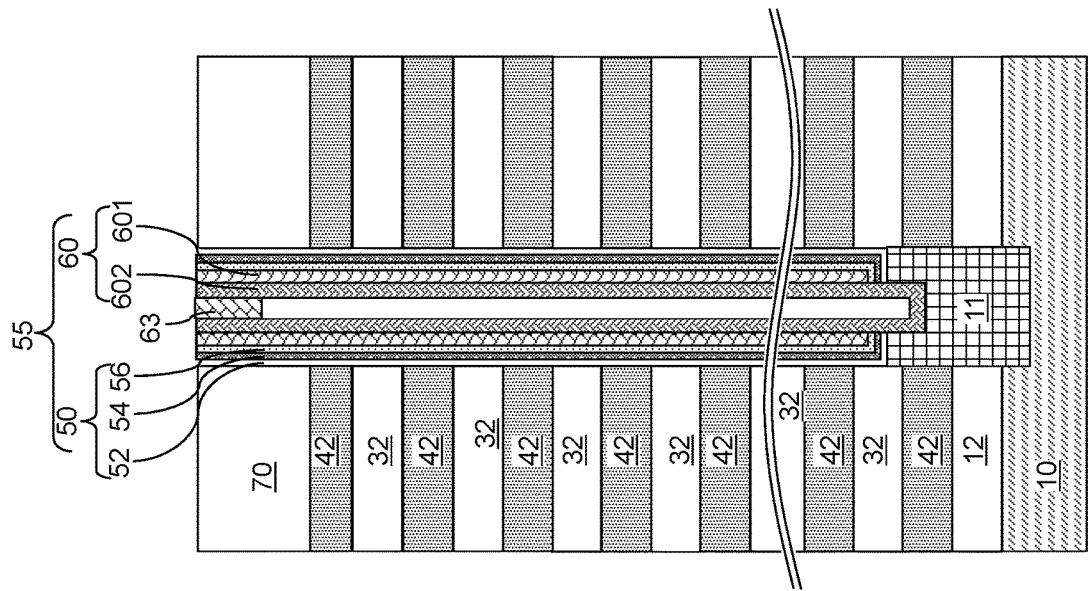
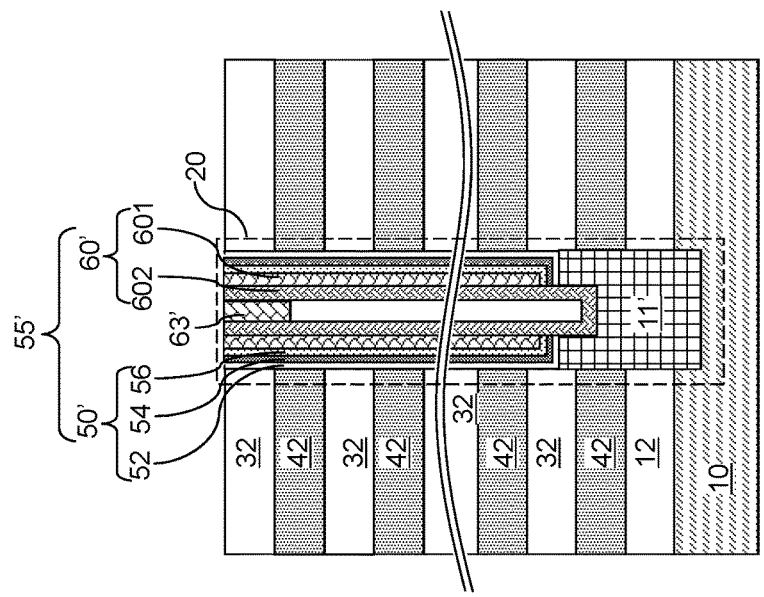

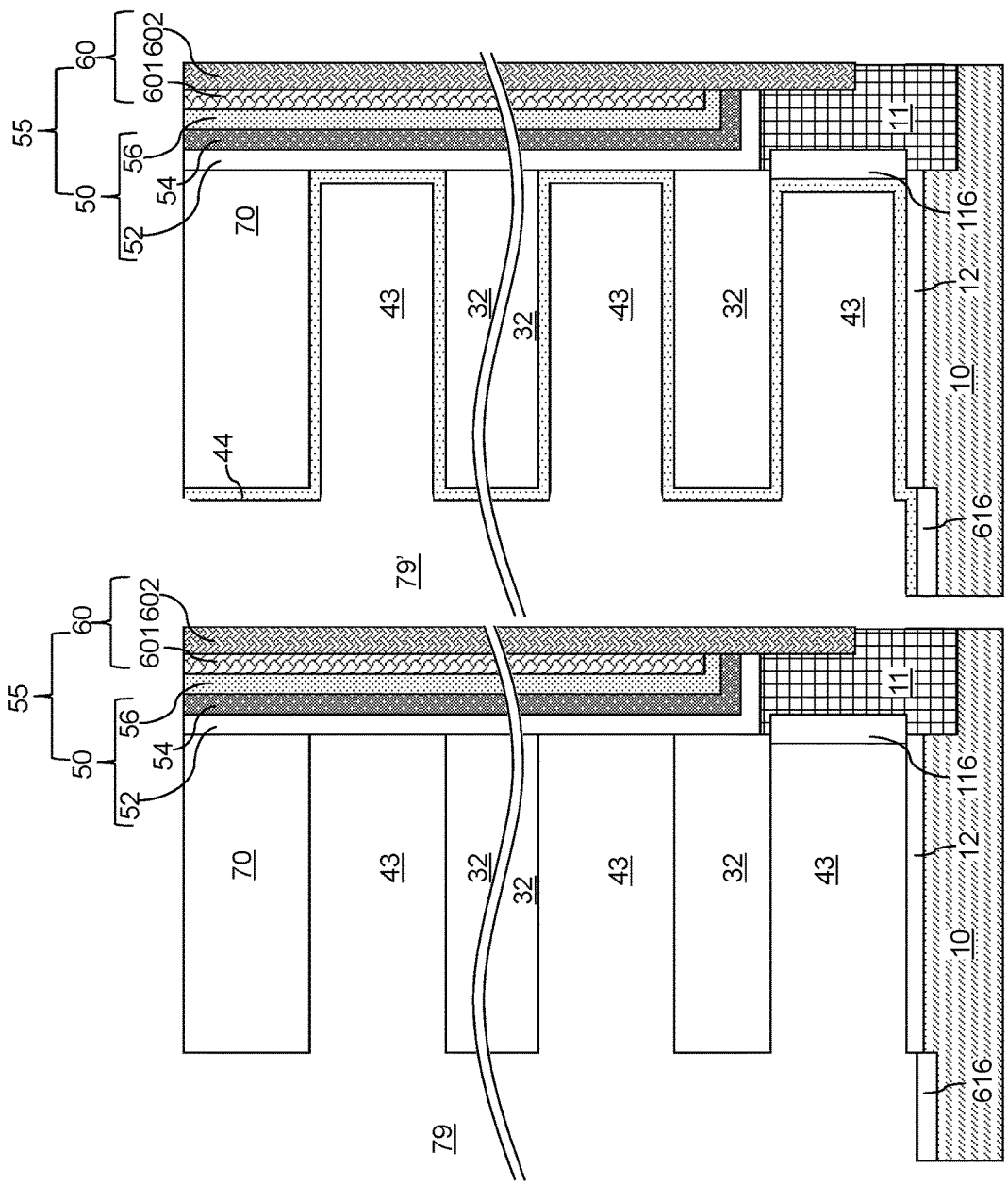

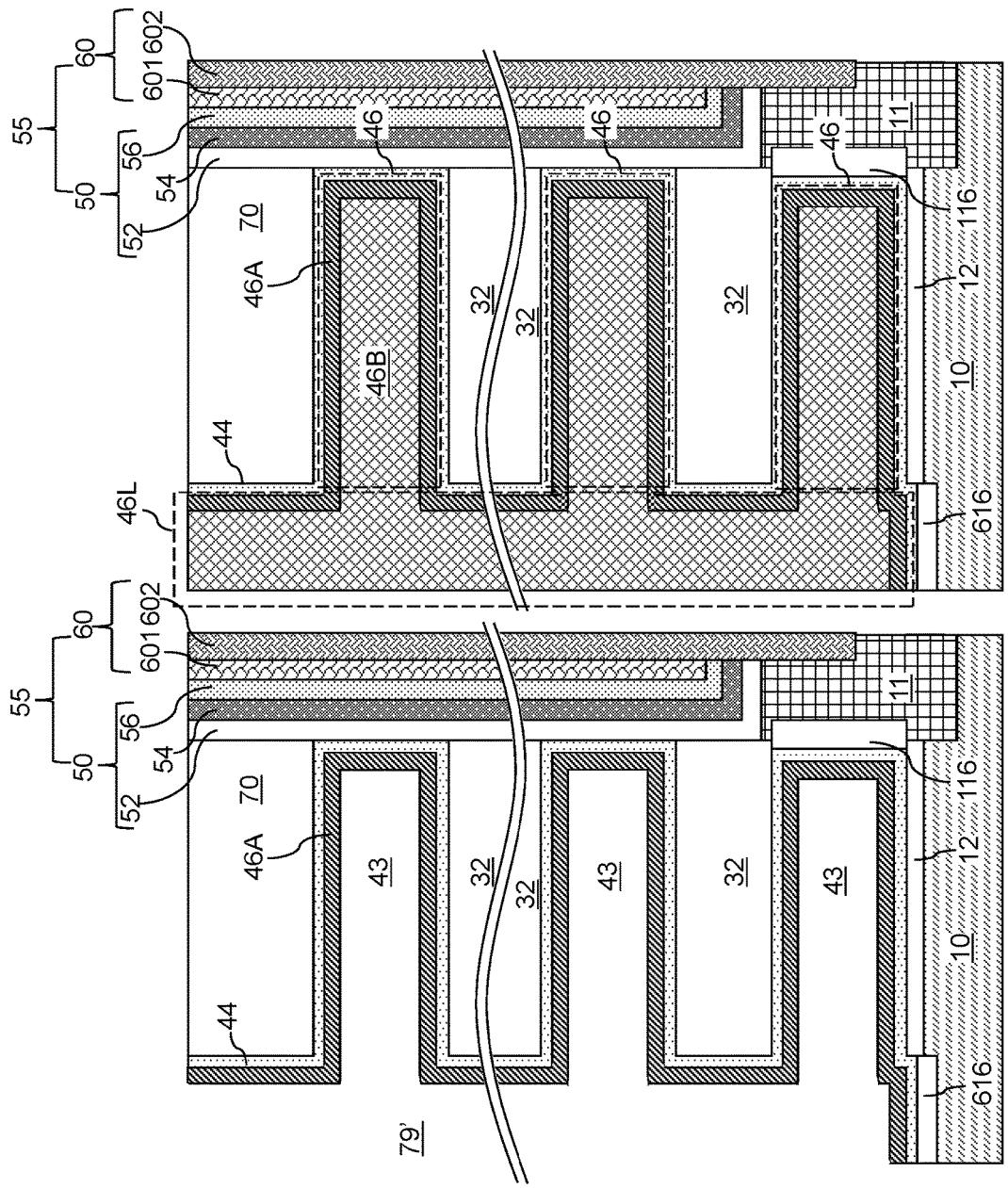

THREE-DIMENSIONAL MEMORY DEVICE CONTAINING SUPPORT PILLARS UNDERNEATH A RETRO-STEPPED DIELECTRIC MATERIAL AND METHOD OF MAKING THEREOF

FIELD

The present disclosure relates generally to the field of semiconductor devices, and particular to a three-dimensional memory device containing support pillars underneath a retro-stepped dielectric material portion and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises an alternating stack of insulating layers and electrically conductive layers located over a substrate, wherein the alternating stack comprises a memory array region and a terrace region, memory stack structures extending through the memory array region of the alternating stack, wherein each of the memory stack structures comprises a respective memory film and a respective vertical semiconductor channel contacting an inner sidewall of the respective memory film, and support pillar structures extending through the terrace region of the alternating stack. The support pillar structures have different heights from each other.

According to another aspect of the present disclosure, a method of forming a three-dimensional memory device is provided. The method comprises forming an alternating stack of insulating layers and spacer material layers over a substrate, patterning the alternating stack to form a terrace region in which stepped surfaces continuously extend from a bottommost layer within the alternating stack to a topmost layer within the alternating stack, forming a sacrificial retro-stepped dielectric material portion over the stepped surfaces of the alternating stack, forming memory openings in a memory array region through each layer within the alternating stack and forming support openings through the sacrificial retro-stepped dielectric material portion and through a subset of layers within the alternating stack in the terrace region, removing the sacrificial retro-stepped dielectric material portion selective to materials of the alternating stack, and simultaneously forming memory stack structures in the memory openings and support pillar structures in the support openings.

BRIEF DESCRIPTION OF THE DRAWINGS

FIG. 5B is a top-down view of the exemplary structure of FIG. 5A. The vertical plane A-A' is the plane of the cross-section for FIG. 5A.

FIGS. 10A-10G are sequential schematic vertical cross-sectional views of a support opening during formation of a support pillar structure therein.

FIGS. 11A-11G are sequential schematic vertical cross-sectional views of a memory opening during formation of a memory stack structure, a dielectric core, and a drain region therein. Across FIGS. 10A-10G and 11A-11G, figures with a same alphabetical suffix correspond to a same processing step.

FIGS. 15A-15D are sequential vertical cross-sectional views of a region of the exemplary structure during formation of electrically conductive layers according to an embodiment of the present disclosure.

DETAILED DESCRIPTION

Figure 1:
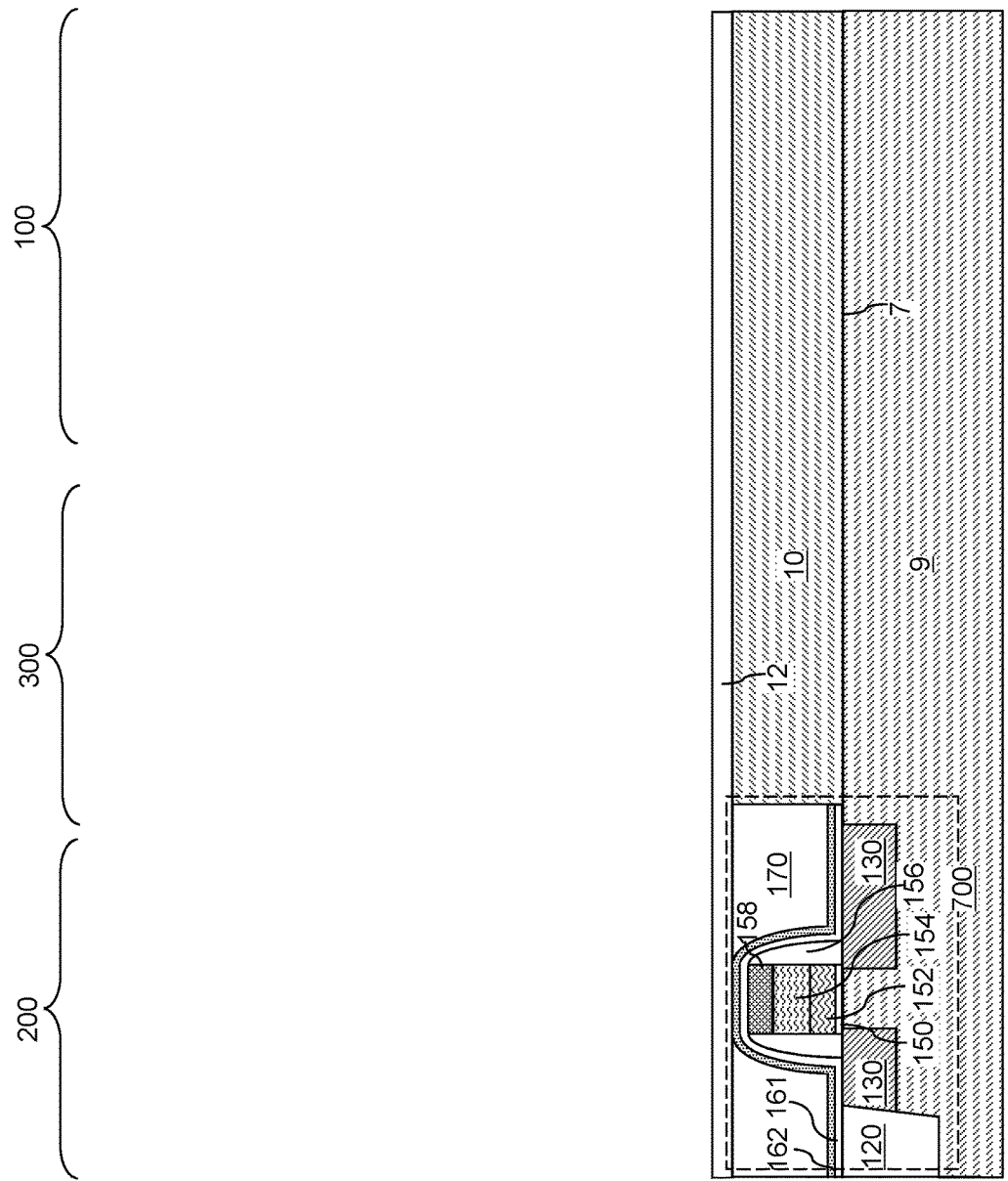
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device employing support pillars underneath a retro-stepped dielectric material portion and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
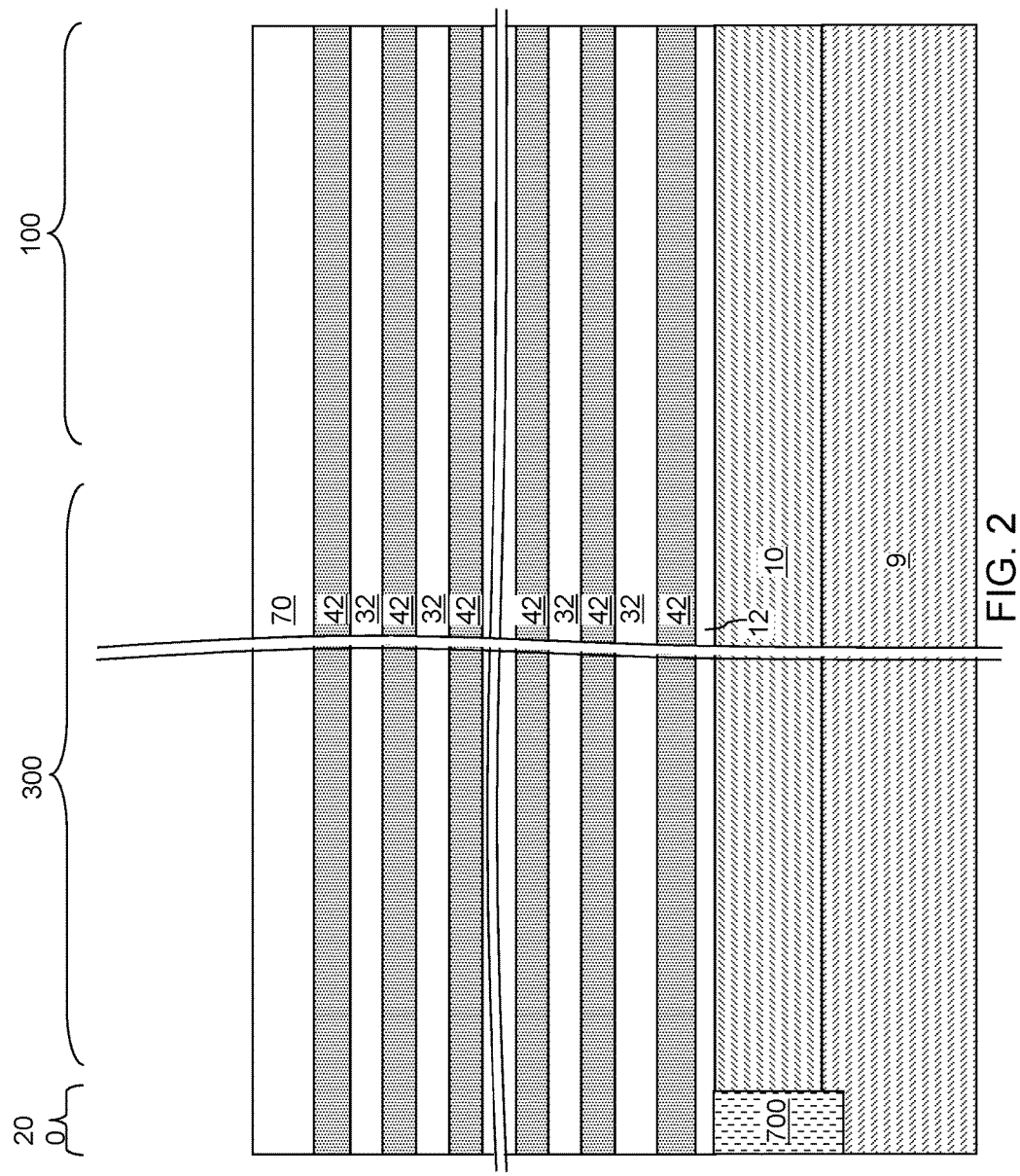
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a spacer material layer (e.g., a control gate electrode or a sacrificial material layer 42) can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
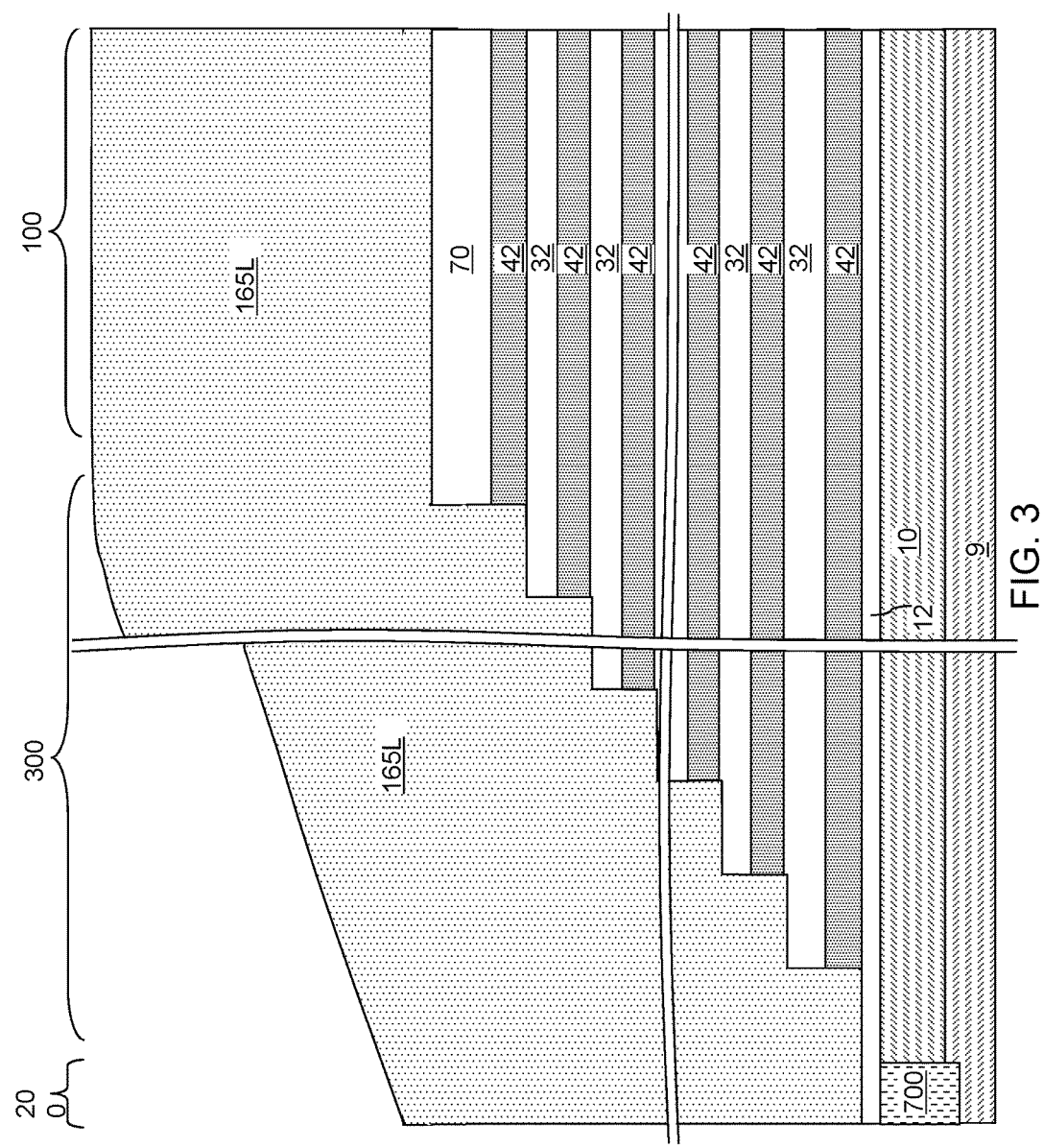
FIG. 3 is a schematic vertical cross-sectional view of the exemplary structure after formation of stepped terraces and deposition of a sacrificial dielectric material layer according to an embodiment of the present disclosure.

Referring to FIG. 3, a stepped cavity can be formed within the contact region 300 which is located between the memory array region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region including stepped terraces is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A sacrificial dielectric material layer 165L is formed over the stepped terraces of the terrace region and over the insulating cap layer 70. The sacrificial dielectric material layer 165 includes a dielectric material that can be removed selective to the insulating cap layer 70, the insulating layers 32, and the sacrificial material layers 42. In one embodiment, the insulating layers 32 and the insulating cap layer 70 can include TEOS oxide materials, which are undoped silicate glasses (i.e., silicon oxide) formed by decomposition of tetraethylorthosilicate (TEOS) precursor in a low pressure chemical vapor deposition process or a plasma enhanced chemical vapor deposition process and optionally densified in an anneal at an elevated temperature. The sacrificial material layers 42 can include silicon nitride or a semiconductor material such as amorphous silicon, polysilicon, or a silicon-germanium alloy. In case electrically conductive layers are employed as spacer material layers in lieu of the sacrificial material layers 42, a doped semiconductor material or a metallic material (such as tungsten or copper) may be employed as the electrically conductive layers that are provided between the insulating layers 32.

In one embodiment, the sacrificial dielectric material layer 165L includes a material that can be removed with selectivities greater than 10, and preferably greater than 100, and more preferably greater than 300 with respect to the materials of the insulating cap layer 70, the insulating layers 32, and the sacrificial material layers 42 in an isotropic etch process. In one embodiment, the sacrificial dielectric material layer 165L can include borosilicate glass (BSG), and a vapor phase hydrofluoric acid etch process can be the isotropic etch process that provides etch selectivities greater than 10 with respect to the TEOS oxide materials of the insulating layers 32 and the insulating cap layer 70 and with respect to the material of the sacrificial material layers 42 (such as silicon nitride). The vapor phase hydrofluoric acid etch process can provide hydrofluoric acid vapor, which can remove the borophosphosilicate glass (BSG) of the sacrificial dielectric material layer 165L with a selectivity greater than 10, and typically greater than 1,000, with respect to the TEOS oxide materials of the insulating layers 32 and the insulating cap layer 70 and with respect to silicon nitride.

Alternatively, a porous organosilicate glass (OSG) material can be employed for the sacrificial dielectric material layer 165L. Preferably but not necessarily, the porous organosilicate glass can be doped with dopants such as boron to enhance the selectivity of the vapor phase hydrofluoric acid etch process with respect to the TEOS oxide materials of the insulating layers 32 and the insulating cap layer 70 and with respect to silicon nitride.

Figure 4:
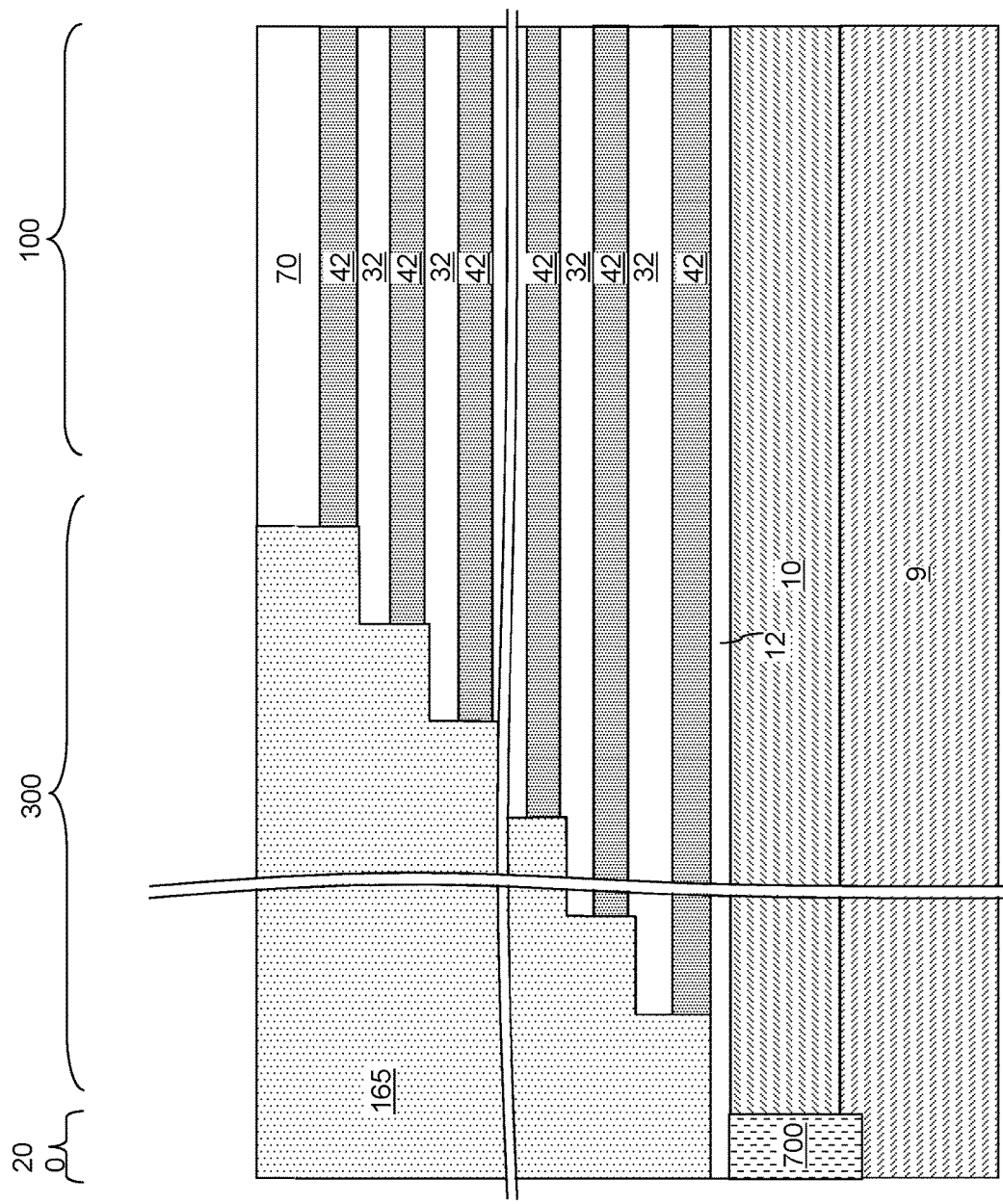
FIG. 4 is a schematic vertical cross-sectional view of the exemplary structure after formation of a sacrificial retro-stepped dielectric material portion according to an embodiment of the present disclosure.

Referring to FIG. 4, the sacrificial dielectric material layer 165L can be planarized by a planarization process to remove portions that protrude above a horizontal plane including the top surface of the insulating cap layer 70. For example, a chemical mechanical planarization (CMP) process can be performed to remove the material of the sacrificial dielectric material layer 165L from above the horizontal plane including the top surface of the insulating cap layer 70. The insulating cap layer 70 can be employed as a stopping layer during the CMP process. The remaining portion of the sacrificial dielectric material layer 165L contacting the stepped surfaces of the alternating stack (32, 42) includes stepped surfaces on a bottom side, and is herein referred to as a sacrificial retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present.

Figure 5A:
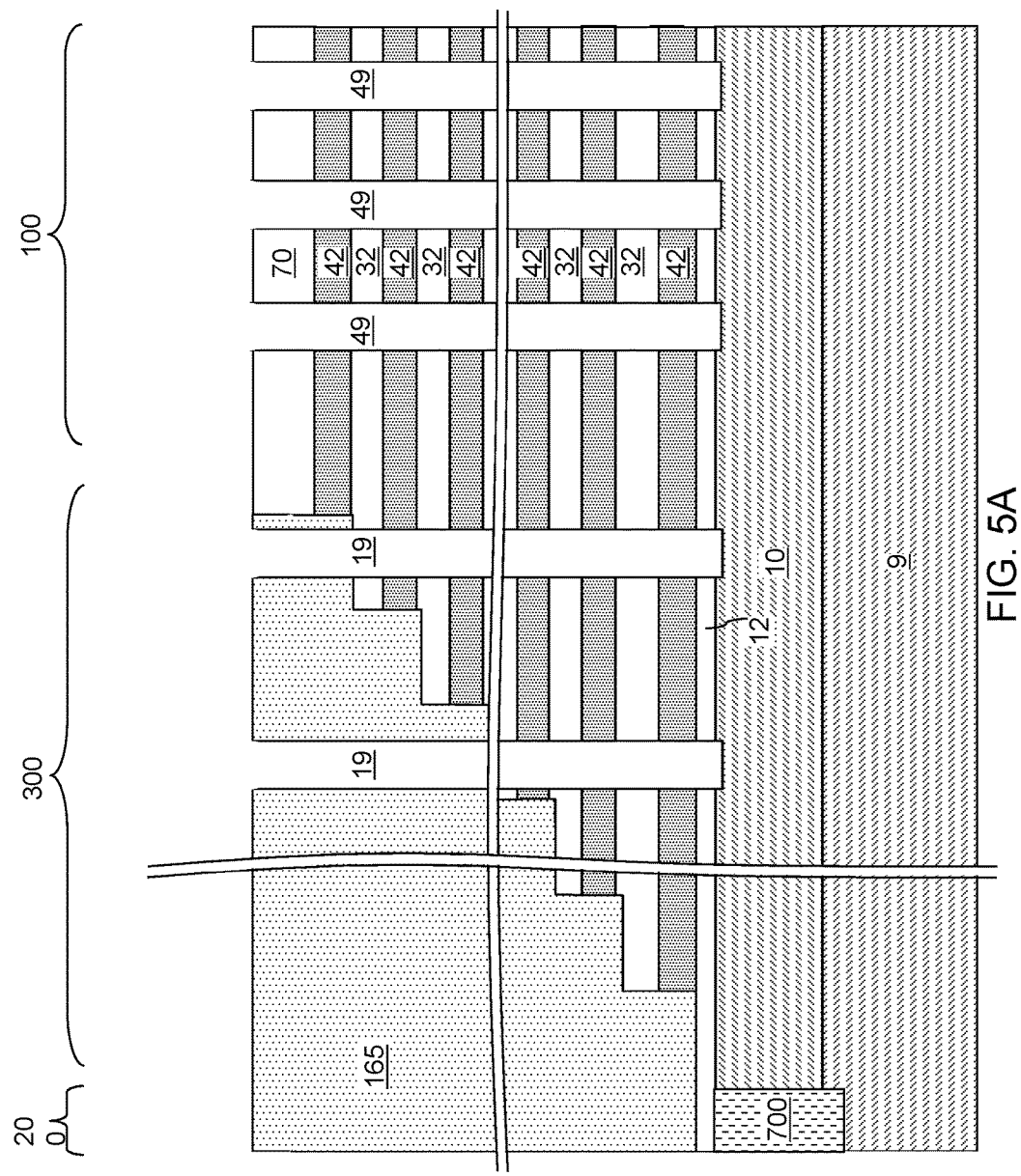
FIG. 5A is a schematic vertical cross-sectional view of the exemplary structure after formation of memory openings and support openings according to an embodiment of the present disclosure.

Referring to FIGS. 5A and 5B, memory openings 49 can be formed in a memory array region 100 through each layer within the alternating stack (32, 42) while forming support openings 19 through the sacrificial retro-stepped dielectric material portion 165 and through a subset of layers within the alternating stack (32, 42) in the terrace region (i.e., in the contact region 300). For example, a lithographic material stack (not shown) including at least a photoresist layer can be formed over the insulating cap layer 70 and the sacrificial retro-stepped dielectric material portion 165, and can be lithographically patterned to form openings therein. The memory openings 49 and the support openings 19 are simultaneously formed through the alternating stack (32, 42).

The openings include a first set of openings formed over the memory array region 100 and a second set of openings formed over the contact region 300. The pattern in the lithographic material stack can be transferred through the insulating cap layer 70 or the sacrificial retro-stepped dielectric material portion 165, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the sacrificial retro-stepped dielectric material portion 165 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 6:
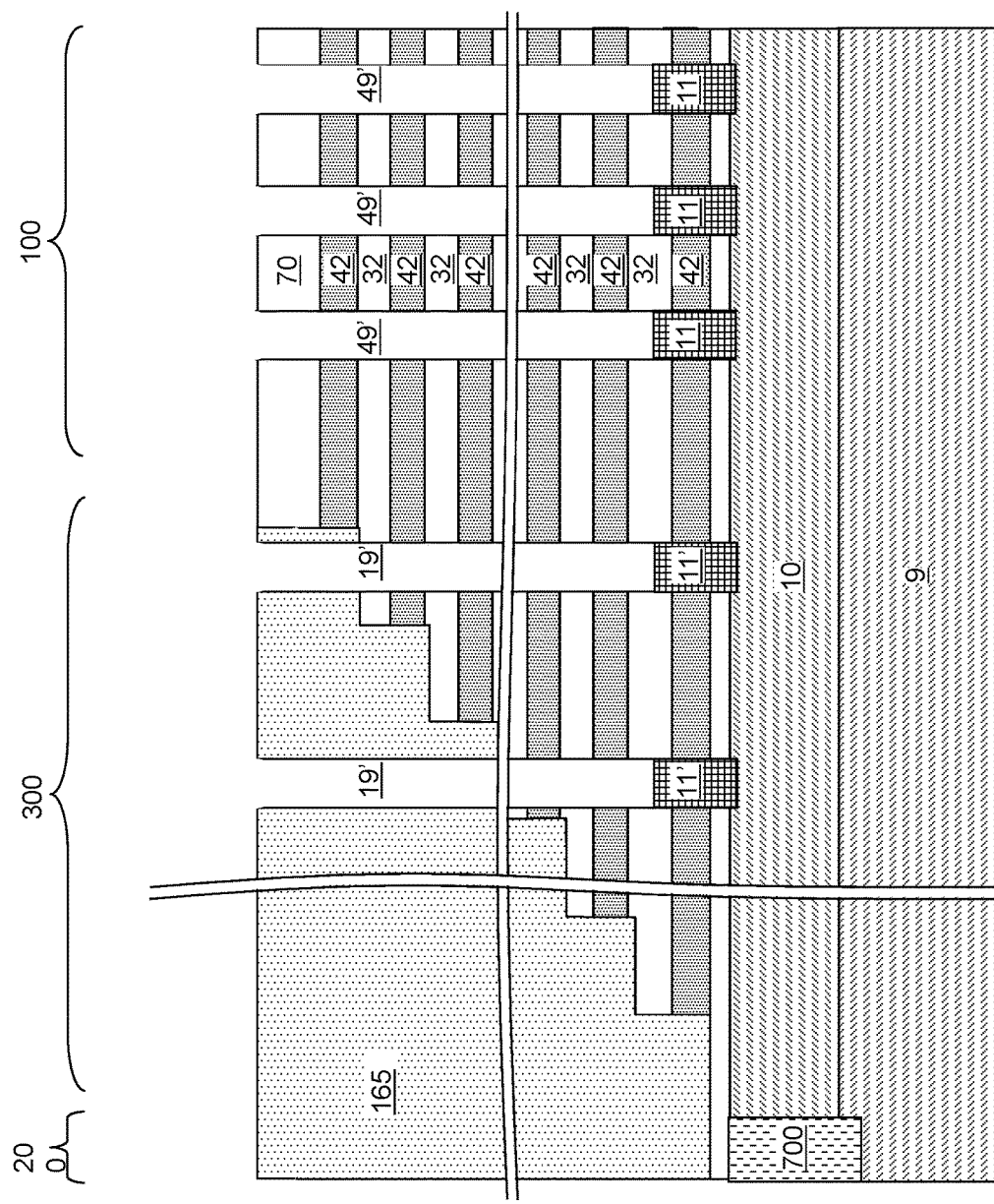
FIG. 6 is a schematic vertical cross-sectional view of the exemplary structure after formation of pillar channel portions according to an embodiment of the present disclosure.

Referring to FIG. 6, a semiconductor material can be optionally deposited at the bottom of each of the memory openings 49 and support openings 19 by a selective semiconductor material deposition process. The selective semiconductor deposition process (which may be a selective epitaxy process) forms a pedestal channel portion (e.g., an epitaxial pedestal) 11 at the bottom portion of each memory opening 49, and a dummy pedestal channel portion 11' at the bottom portion of each support opening 19'. During the selective semiconductor material deposition process, a reactant the deposits a semiconductor material and an etchant that etches a semiconductor material are flowed simultaneously or alternately into a processing chamber including the exemplary structure. The etch rate of the etchant is set between the deposition rate of the semiconductor material on semiconductor surfaces and the deposition rate of the semiconductor material on dielectric surfaces (which is lower than the deposition rate on the semiconductor surfaces). The selective deposition of the semiconductor material proceeds only from physically exposed semiconductor surfaces during the selective semiconductor deposition process. In one embodiment, each pedestal channel portion 11 and each dummy pedestal channel portion 11' comprise a single crystalline semiconductor material in epitaxial alignment with the single crystalline semiconductor material of the semiconductor material layer 10. In one embodiment, the pedestal channel portions 11 and the dummy pedestal channel portions 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer.

Each pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of each memory opening 49 above a respective pedestal channel portion 11. A support cavity 19' is present in the unfilled portion of each support opening 19 above a respective dummy pedestal channel portion 11'. Each dummy pedestal channel portion 11' is a dummy structure, i.e., an electrically inactive structure, through which electrical current does not flow. In one embodiment, the semiconductor material layer 10 can include a single crystalline semiconductor material, and the pedestal channel portions 11 and the dummy pedestal channel portions 11' can comprise single crystalline silicon, and can be epitaxially aligned to a single crystalline semiconductor material of the semiconductor material layer 10. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 7:
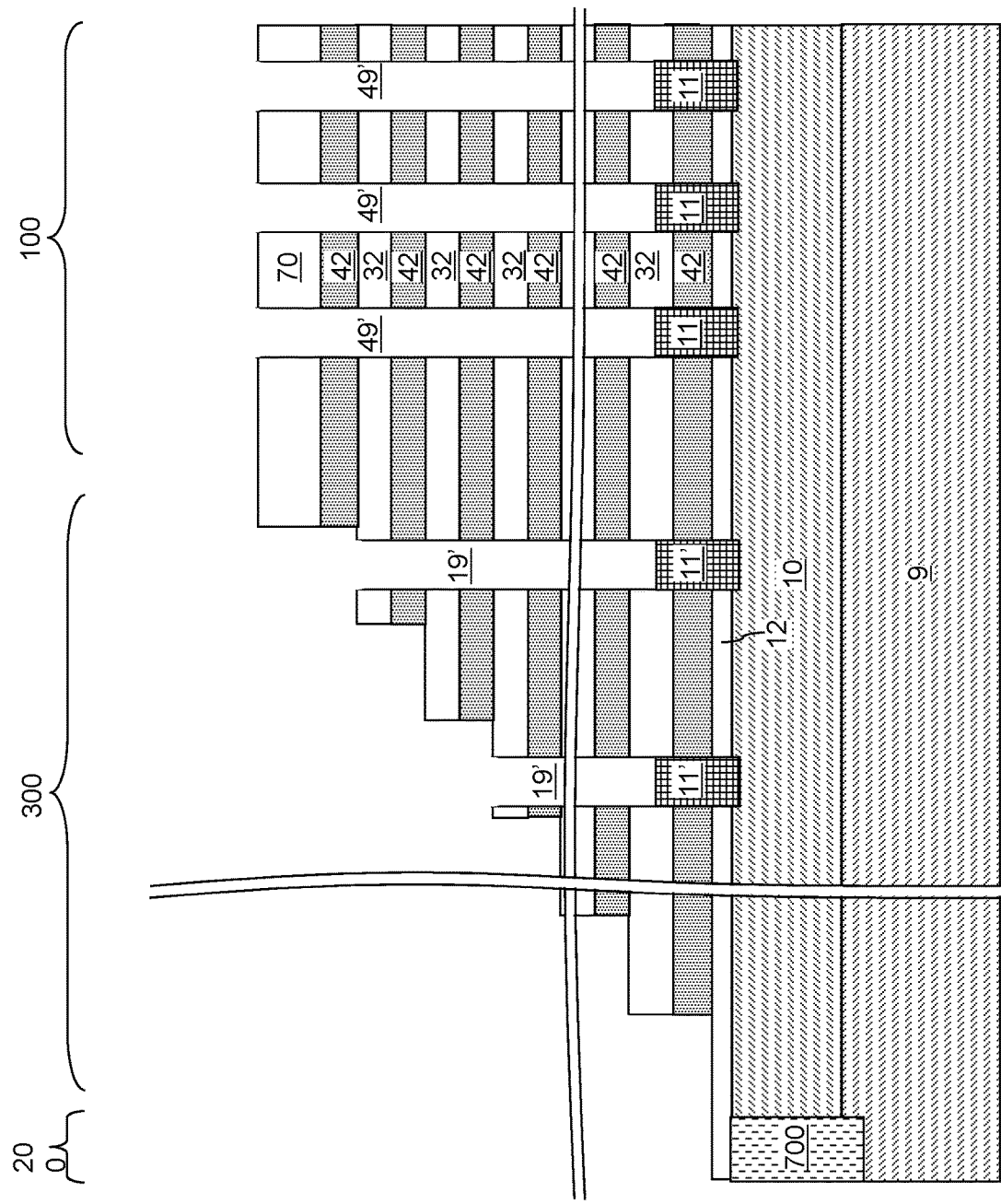
FIG. 7 is a vertical cross-sectional view of the exemplary structure after removal of the sacrificial retro-stepped dielectric material portion selective to the alternating stack and the pillar channel portions according to an embodiment of the present disclosure.

Subsequently, the sacrificial retro-stepped dielectric material portion 165 can be removed selective to the alternating stack (32, 42), the pillar channel portions 11, and the dummy pillar channel portions 11', as shown in FIG. 7. The sacrificial retro-stepped dielectric material portion 165 includes the same material as the sacrificial dielectric material layer 165L. Thus, the sacrificial retro-stepped dielectric material portion 165 includes a material that can be removed with selectivities greater than 10, and preferably greater than 100, and more preferably greater than 300 with respect to the materials of the insulating cap layer 70, the insulating layers 32, and the sacrificial material layers 42 in an isotropic etch process.

In one embodiment, the isotropic etch process can be a vapor phase hydrofluoric etch process in which hydrofluoric acid (HF) vapor is applied to the first exemplary structure at a sub-atmospheric partial pressure of HF vapor. The sub-atmospheric pressure can be in a range from 0.1 mTorr to 1 Torr, such as from 1 mTorr to 100 mTorr, although lesser and greater pressures can also be employed for the vapor phase hydrofluoric etch process. Optionally, an inert gas such as argon or nitrogen can be provided in the vapor phase hydrofluoric etch process. In this case, the total pressure in the process chamber for the vapor phase hydrofluoric etch process may be greater than the partial pressure of the hydrofluoric acid vapor by the sum of partial pressures of the inert gas(es). The total pressure in the process chamber may be in a range from 0.1 mTorr to 100 Torr, such as from 1 mTorr to 1 Torr, although lesser and greater total pressure can also be employed.

In one embodiment, the sacrificial retro-stepped dielectric material portion 165 can include borosilicate glass (BSG), and the insulating layers 32 and the insulating cap layer 70 can include TEOS oxide materials, which are undoped silicate glasses formed by decomposition of tetraethylorthosilicate (TEOS) in a low pressure chemical vapor deposition process or a plasma enhanced chemical vapor deposition process and optionally densified in an anneal at an elevated temperature. As discussed above, the sacrificial material layers 42 can include silicon nitride or a semiconductor material such as amorphous silicon, polysilicon, or a silicon-germanium alloy. In case electrically conductive layers are employed as spacer material layers in lieu of the sacrificial material layers 42, a doped semiconductor material or a metallic material (such as tungsten or copper) may be employed as the electrically conductive layers that are provided between the insulating layers 32.

In case the sacrificial retro-stepped dielectric material portion 165 comprises borosilicate glass (BSG) and the insulating layers 32 and the insulating cap layer 70 comprise TEOS oxide materials, the vapor phase hydrofluoric acid etch process can provide an etch selectivity greater than 100 for the BSG material with respect to the TEOS oxide materials of the insulating layers 32 and the insulating cap layer 70 and with respect to silicon nitride.

Figure 8:
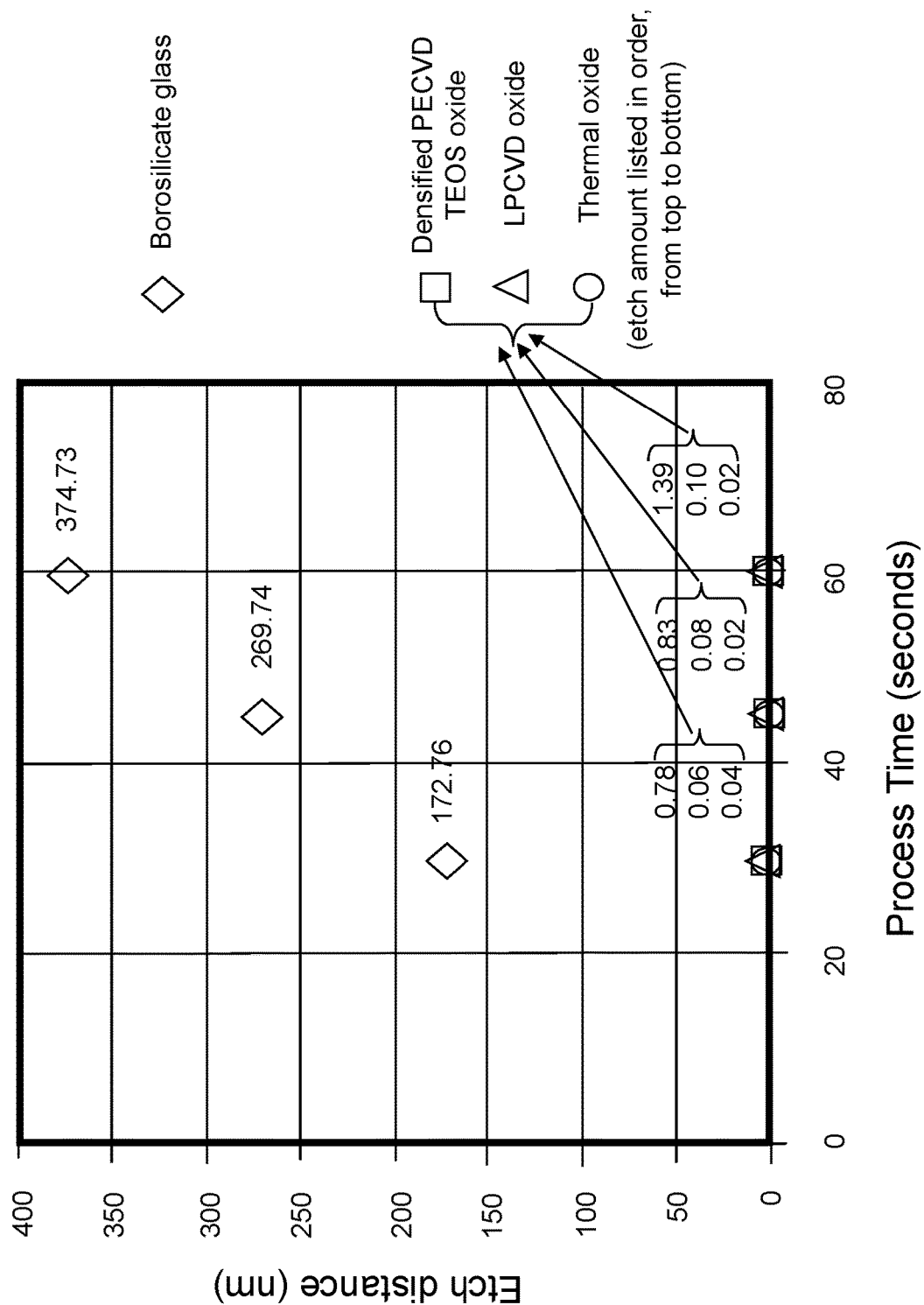
FIG. 8 is a graph illustrating the etch rate of a hydrofluoric acid vapor etch process for various silicon oxide materials.

FIG. 8 shows etch rate data of an exemplary vapor phase hydrofluoric acid etch process for borosilicate glass (BSG) deposited by plasma enhanced chemical vapor deposition (PECVD), for densified TEOS oxide deposited by a PECVD process and densified in an anneal process, for silicon oxide (silicate glass) deposited by decomposition of TEOS in a low pressure chemical vapor deposition (LPCVD) process, and for thermal oxide that is formed by thermal oxidation of single crystalline silicon. The etch rate for BSG in the exemplary vapor phase hydrofluoric acid etch process is at least two orders of magnitude (i.e., by a factor greater than 100) greater than the etch rates for the densified PECVD TEOS oxide, the LPCVD oxide, and the thermal oxide.

Figure 9:
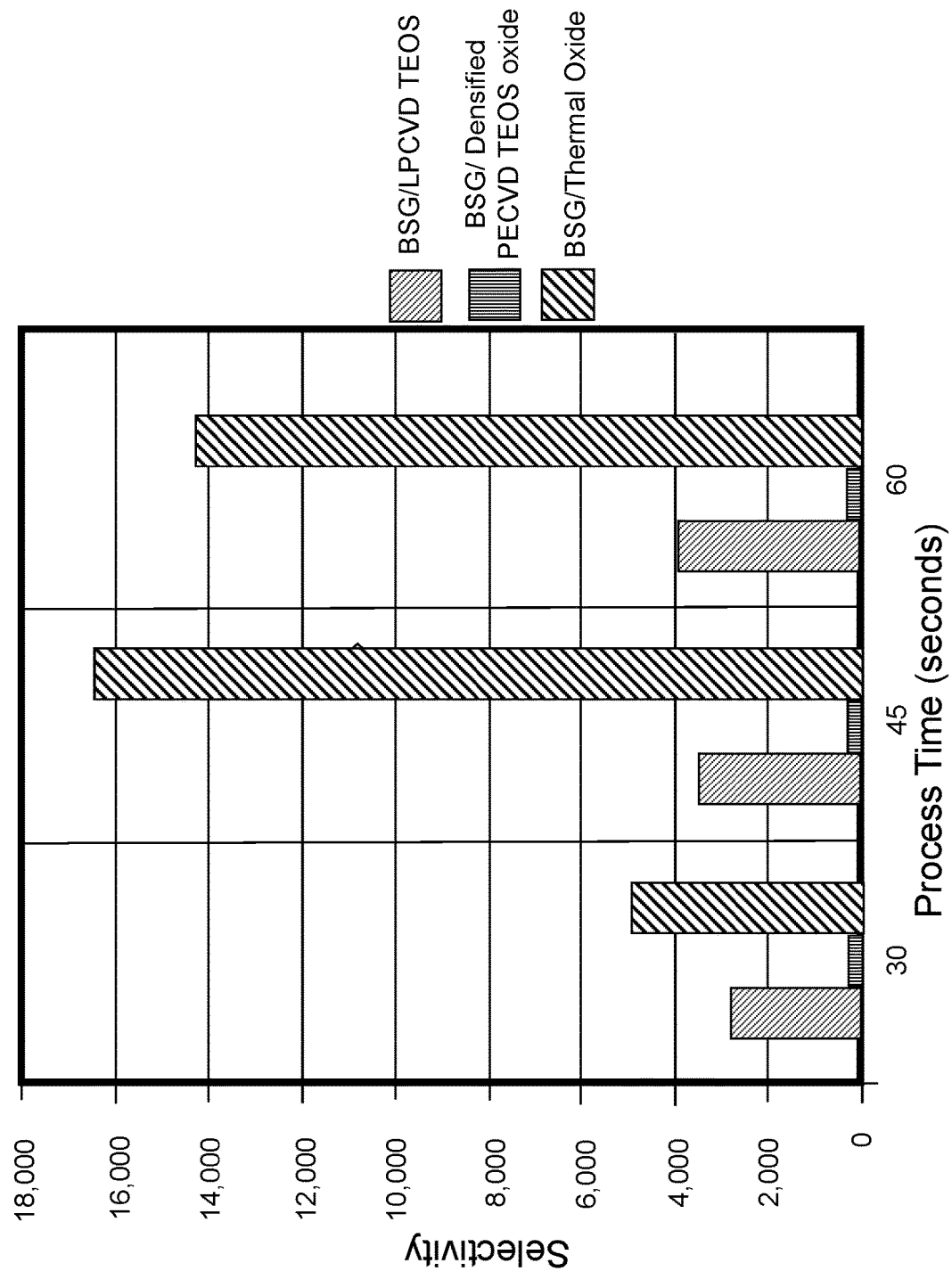
FIG. 9 is a graph illustrating the selectivity of a hydrofluoric acid vapor etch process between borosilicate glass and various silicon oxide materials.

FIG. 9 illustrates the selectivities of the exemplary vapor phase hydrofluoric acid etch process for borosilicate glass (BSG) deposited by plasma enhanced chemical vapor deposition (PECVD) with respect to the densified PECVD TEOS oxide, the LPCVD oxide, and the thermal oxide. The selectivity of the exemplary vapor phase hydrofluoric acid etch process for the BSG material with respect to the densified PECVD TEOS oxide is greater than 100. The selectivity of the exemplary vapor phase hydrofluoric acid etch process for the BSG material with respect to the LPCVD oxide is greater than 1,000. Thus, if the insulating layers 32 and the insulating cap layer 70 include densified PECVD TEOS oxide materials and/or LPCVD oxide (i.e., silicate glass formed by LPCVD decomposition of TEOS), and if the sacrificial retro-stepped dielectric material portion 165 includes a BSG material formed by PECVD, a vapor phase hydrofluoric acid etch process can etch the sacrificial retro-stepped dielectric material portion 165 selective to the insulating layers 32 and the insulating cap layer 70 with selectivities greater than 100. Further, the vapor phase hydrofluoric acid etch process provides selectivity for etching of a BSG material greater than 100 with respect to silicon oxide and semiconductor materials such as amorphous silicon or polysilicon.

In an alternative embodiment, chemical dry etching (CDE) may be used to selectively etch the sacrificial retro-stepped dielectric material portion 165 instead of the hydrofluoric acid vapor etching. In another alternative embodiment, a porous organosilicate glass (OSG) material can be employed for the sacrificial dielectric material layer 165L in lieu of BSG. The porous organosilicate glass can be doped with dopants such as boron to enhance the selectivity of the vapor phase hydrofluoric acid etch process with respect to the TEOS oxide materials of the insulating layers 32 and the insulating cap layer 70 and with respect to silicon nitride. In this case, the vapor phase hydrofluoric acid etch process can etch the sacrificial retro-stepped dielectric material portion 165 selective to the insulating layers 32 and the insulating cap layer 70 with selectivities greater than 10, and typically greater than 30 and/or greater than 100. Thus, the sacrificial retro-stepped dielectric material portion 165 is removed selective to materials of the alternating stack (32, 42).

Subsequently, memory stack structures and support pillar structures are formed in the memory openings and in the support openings, respectively. FIGS. 10A-10G illustrate a support opening 19 during formation of a support pillar structure therein. FIGS. 11A-11G illustrate a memory opening 49 during formation of a memory stack structure, a dielectric core, and a drain region therein. Across FIGS. 10A-10G and 11A-11G, figures with a same alphabetical suffix correspond to a same processing step.

Figure 10B:
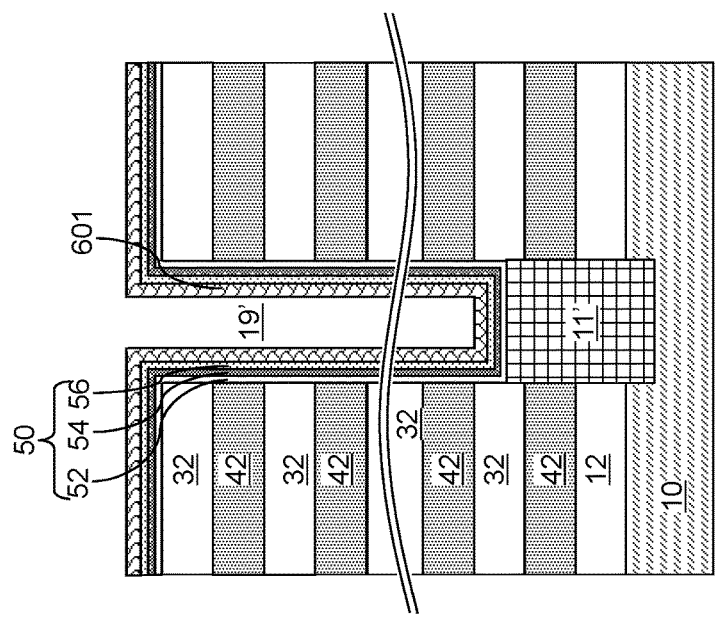

Referring to FIGS. 10A and 10B, a support opening including a dummy pillar channel portion 11' and a support cavity 19' and a memory opening including a pillar channel portion 11 and a memory cavity 49' are shown after the processing steps of FIG. 7.

Figure 11B:
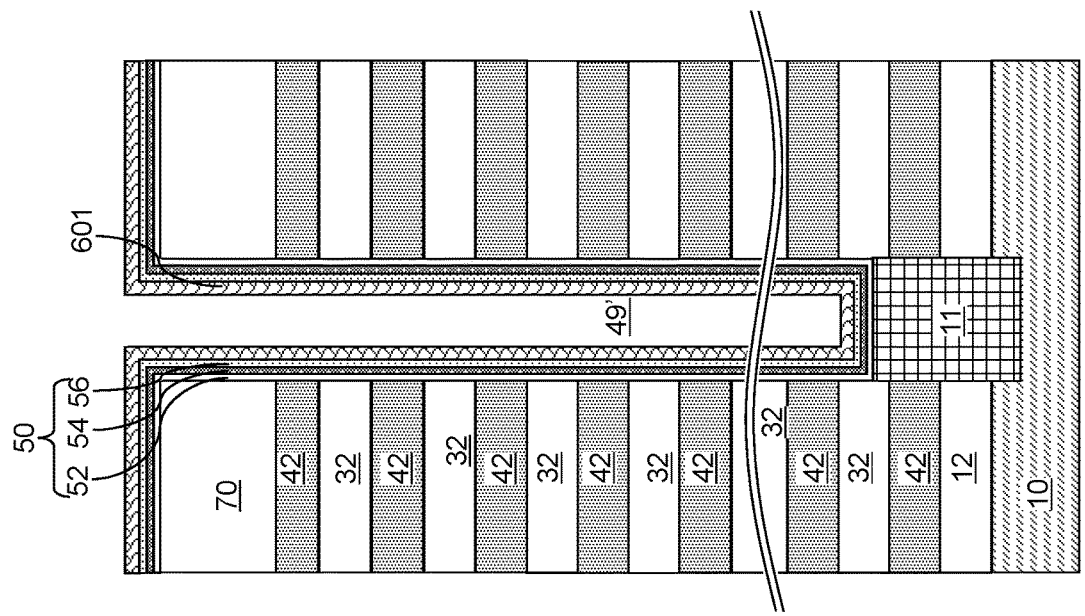

Referring to FIGS. 10B and 11B, a stack of layers including a blocking dielectric layer 52, a charge storage layer 54, a tunneling dielectric layer 56, and an optional first semiconductor channel layer 601 can be sequentially deposited in the memory openings 49 and in the support openings 19. Each layer in the stack of layers (52, 54, 56, 601) is deposited as a continuous layer. Thus, the blocking dielectric layer 52 is deposited as a continuous blocking dielectric layer, the charge storage layer 54 is deposited as a continuous charge storage material layer, the tunneling dielectric layer 56 is deposited as a continuous tunneling dielectric layer, and the first semiconductor channel layer 601, if present, is formed as a continuous outer semiconductor channel layer.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is present in the volume of each memory opening 49 that is not filled with the deposited material layers (52, 54, 56, 601). A support cavity 19' is present in the volume of each support opening 19 that is not filled with the deposited material layers (52, 54, 56, 601).

Referring to FIGS. 10C and 11C, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at the bottom of each memory cavity 49' and each support cavity 19' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' and each support cavity 19' can be vertically recessed so that the recessed semiconductor surface is vertically offset from the topmost surface of the pedestal channel portion 11 or the dummy pedestal channel portion 11' (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. A set of a blocking dielectric layer 52, a charge storage layer 54, and a tunneling dielectric layer 56 in a support opening 19 constitutes a dummy memory film 50'. In one embodiment, the first semiconductor channel layer 601, the tunneling dielectric layer 56, the charge storage layer 54, and the blocking dielectric layer 52 can have vertically coincident sidewalls within each memory opening 49 and within each support opening.

Figure 11D:
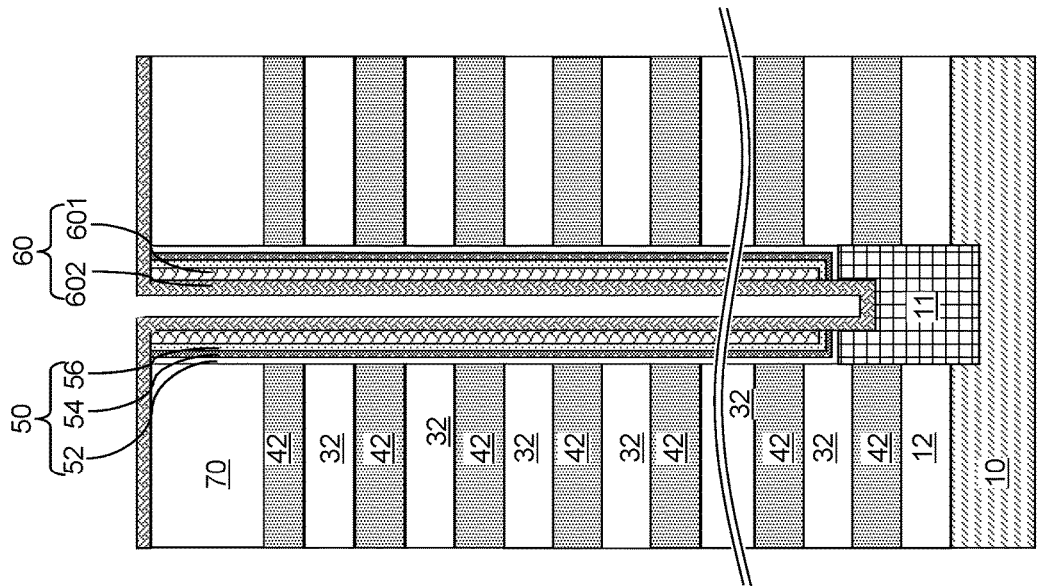
Figure 10D:
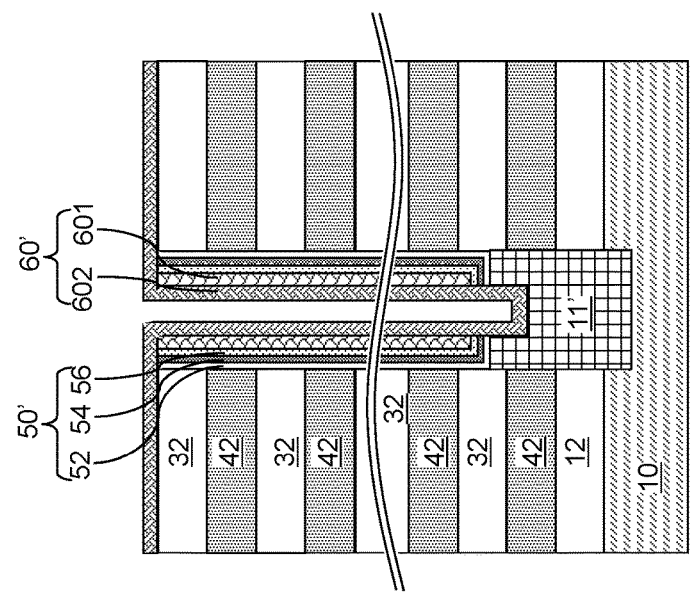

Referring to FIGS. 10D and 11D, a second semiconductor channel layer 602 can be deposited directly on the semiconductor surfaces of the pedestal channel portions 11 and the dummy pedestal channel portions 11' (or the semiconductor substrate layer 10 if the pedestal channel portion 11 is omitted), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 fills, partially or fully, the memory cavities 49' in the memory openings 49 and the support cavities 19' in the support openings 19.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. A combination of the first semiconductor channel layer 601 and the second semiconductor channel layer 602 within each memory opening 49 constitutes a vertical semiconductor channel 60. A combination of the first semiconductor channel layer 601 and the second semiconductor channel layer 602 within each support opening 19 constitutes a dummy vertical semiconductor channel 60'.

Referring to FIGS. 10E and 11E, in case the memory cavities 49' or the support cavities 19' are not completely filled by the second semiconductor channel layer 602, a dielectric core layer 62L can be deposited in the memory cavities 49' or the support cavities 19'. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 11F:
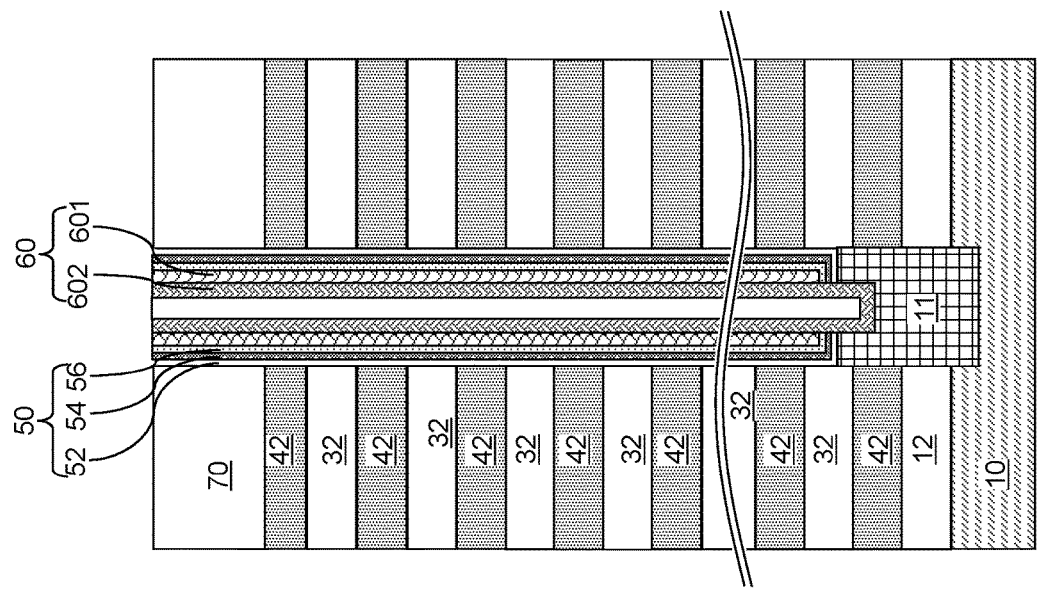
Figure 10F:
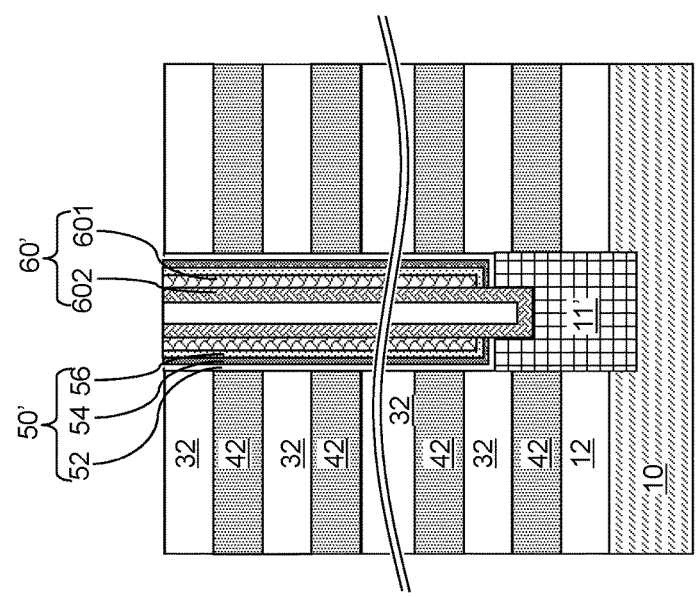

Referring to FIGS. 10F and 11F, the horizontal portion of the dielectric core layer 62L the horizontal portion of the second semiconductor channel layer 602 above the alternating stack (32, 42) or the insulating cap layer 70 can be removed, for example, by a recess etch. Portions of the dielectric core layer 62L and the second semiconductor channel layer 602 are removed from above the top surface of a material layer that directly underlies the second semiconductor channel layer 602 by the recess etch. Specifically, within the memory array region, the second semiconductor channel layer 602 is removed from above the top surface of the insulating cap layer 70 by the recess etch. Within the contact region 300, the second semiconductor channel layer 602 is removed from above the top surface of the topmost layer of the alternating stack (32, 42) that contacts a bottom surface of the second semiconductor channel layer 602 by the recess etch. The recess etch may include a first step for etching the material of the dielectric core layer 62L and a second step for etching the material of the second semiconductor channel layer 602. Each remaining portion of the dielectric core layer 62L constitutes a dielectric core 62. Each remaining portion of the second semiconductor channel layer 602 can be located entirety within a memory opening 49 or entirely within a support opening 19.

Each adjoining pair of a first semiconductor channel layer 601 and a second semiconductor channel layer 602 within a memory opening 49 constitutes a vertical semiconductor channel 60 through which electrical current can flow when a vertical NAND device including the vertical semiconductor channel 60 is turned on. Each adjoining pair of a first semiconductor channel layer 601 and a second semiconductor channel layer 602 within a support opening 19 constitutes a dummy vertical semiconductor channel 60', which is not an active component and does not flow an electrical current therethrough. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 within a memory opening 49 collectively constitutes a memory film 50, which can store electrical charges with a macroscopic retention time. Each adjoining set of a blocking dielectric layer 52, a charge storage layer 54, and a tunneling dielectric layer 56 within a support opening 19 collectively constitutes a dummy memory film 50', which is not an active component and does not store electrical charges therein. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIGS. 10G and 11G, the top surface of each dielectric core 62 can be further recessed within each memory opening, for example, by a recess etch. Within the memory openings 49 in the memory array region 100, each dielectric core 62 can be vertically recessed to a depth that is located between the top surface of the insulating cap layer 70 and the bottom surface of the insulating cap layer 70. In one embodiment, the recess etch may remove all of the dielectric core 62 material from some or all of the support openings 19, such as remove all of the dielectric core 62 material from at least the shallower support openings 19 but not the deeper support openings because the support openings 19 have different depths from each other depending on their location. Drain regions 63 and dummy drain regions 63' can be formed by depositing a doped semiconductor material within each recessed region above the dielectric cores 62. The drain regions 63 are formed in the recessed regions within the memory openings 49, and the dummy drain regions 63' are formed within the recessed regions within the support openings 19. The drain regions 63 and the dummy drain regions 63' can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by a recess etch.

Each combination of a memory film 50 and a vertical semiconductor channel 60 within a memory opening 49 constitutes a memory stack structure 55. Each combination of a dummy memory film 50' and a dummy vertical semiconductor channel 60' within a support opening 19 constitutes a dummy memory stack structure 55'. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a dummy pedestal channel portion 11' (if present), a dummy memory film 50', a dummy vertical semiconductor channel 60', an optional dielectric core 62, and a dummy drain region 63' within each support opening 19 fills the respective support openings 19, and constitutes a support pillar structure 20.

Figure 12:
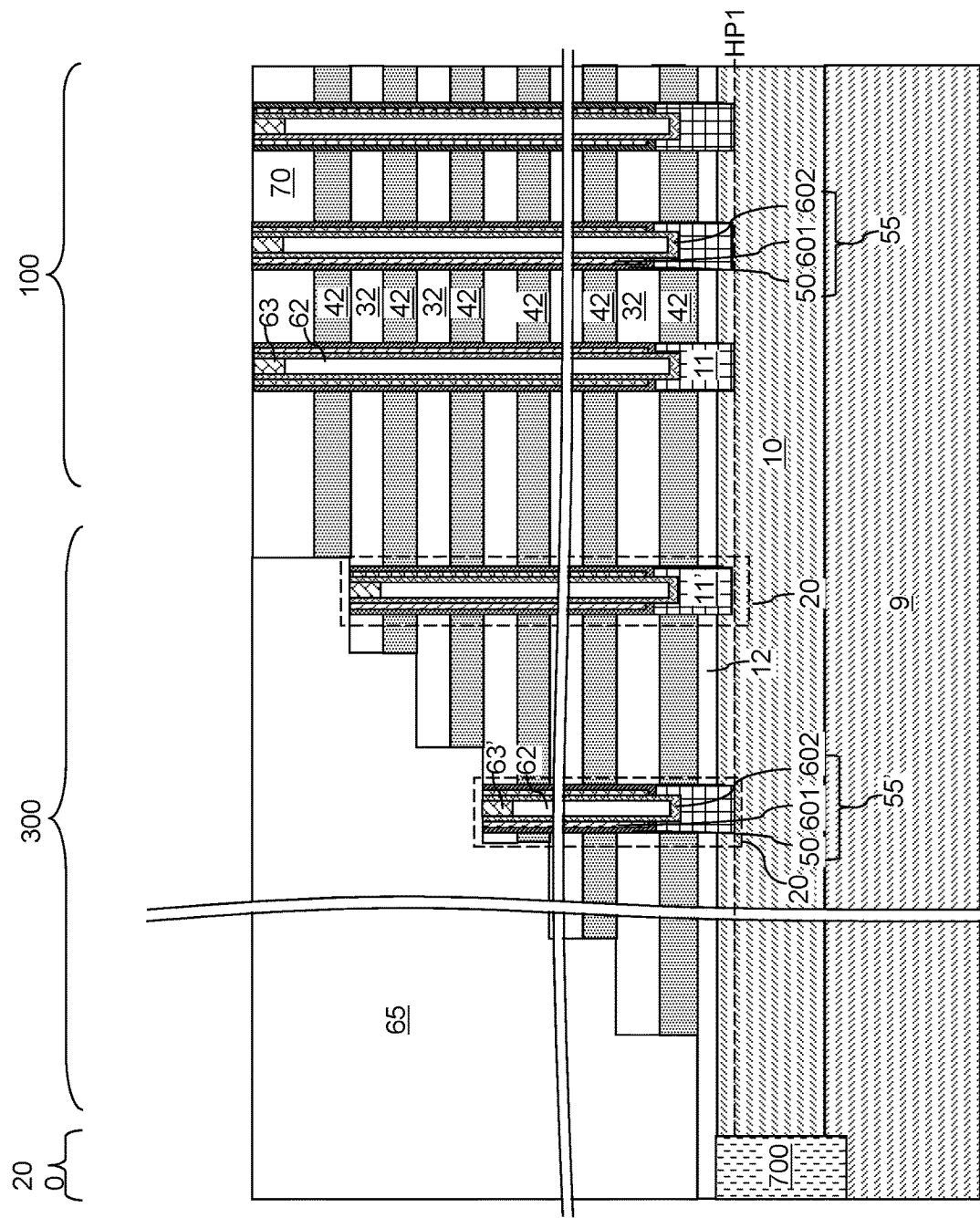
FIG. 12 is a schematic vertical cross-sectional view of the exemplary structure after formation of memory stack structures and support pillar structures according to an embodiment of the present disclosure.

FIG. 12 illustrates the exemplary structure after the processing steps of FIGS. 10G and 11G. The memory stack structures 55 extend through the memory array region 100 of the alternating stack (32, 42) that includes each layer within the alternating stack (32, 42). Each of the memory stack structures 55 comprises a respective memory film 50 and a respective vertical semiconductor channel 60 contacting an inner sidewall of the respective memory film 50. All of the memory stack structures 55 are formed with a same height.

The support pillar structures 20 extend through a respective subset of the alternating stack (32, 42) that includes less than all layers within the alternating stack (32, 42). The support pillar structures 20 are formed in the terrace region (i.e., in the contact region 300), and have respective heights that vary among one another (i.e., the support pillar structures 20 have different heights from each other). In one embodiment, at least some support pillar structures 20 or all support pillar structures 20 can have a height that is less than the height of the memory stack structures 55. As used herein, the term height means the distance from the top surface of the substrate to the top surface of the respective structure. Specifically, at least some of the support pillar structures 20 can have a respective topmost surface that is more proximal to a top surface of the substrate (9, 10) than topmost surfaces of the memory stack structures 55 are to the top surface of the substrate (9, 10). Each topmost surface of the support pillar structures 20 can be coplanar with a respective layer within the alternating stack (32, 42). For example, each topmost surface of the support pillar structures 20 can be coplanar with a respective insulating layer 32 within the alternating stack (32, 42)

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. If silicon oxide is employed for the retro-stepped dielectric material portion 65, the silicon oxide of the retro-stepped dielectric material portion 65 may, or may not, be doped with dopants such as B, P, and/or F.

The retro-stepped dielectric material portion 65 is formed directly on the stepped surfaces of the terrace region. In one embodiment, the memory stack structures 55 can be formed through the insulating cap layer 70 and the alternating stack (32, 42). A top surface of the retro-stepped dielectric material portion 65 can be formed within the same horizontal plane as a top surface of the insulating cap layer 70. In one embodiment, the retro-stepped dielectric material portion 65 can be formed directly on the physically exposed horizontal top surfaces of the insulating layers 32 in the terrace region. The retro-stepped dielectric material portion 65 includes bottom surfaces located at different levels, and at a respective distance from the top surface of the substrate (9, 10) that are different among one another. In one embodiment, the retro-stepped dielectric material portion 65 can be formed on the topmost surfaces of the support pillar structures 20. In other words, the topmost surfaces of the support pillar structures 20 can contact a respective one of the multiple horizontal bottom surfaces of the retro-stepped dielectric material portion 65.

Figure 13A:
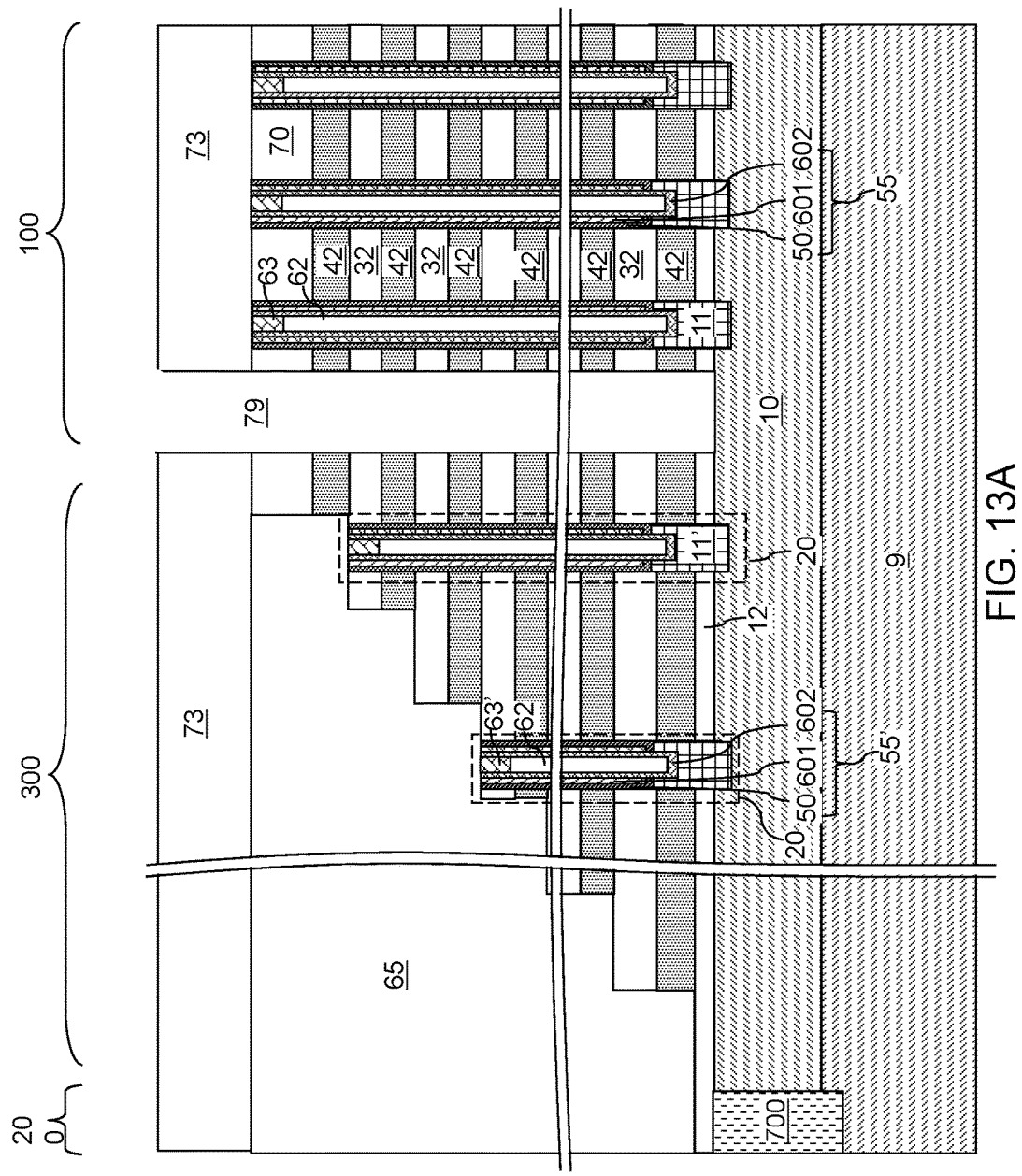
FIG. 13A is a schematic vertical cross-sectional view of the exemplary structure after formation of a backside trench according to an embodiment of the present disclosure.
Figure 13B:
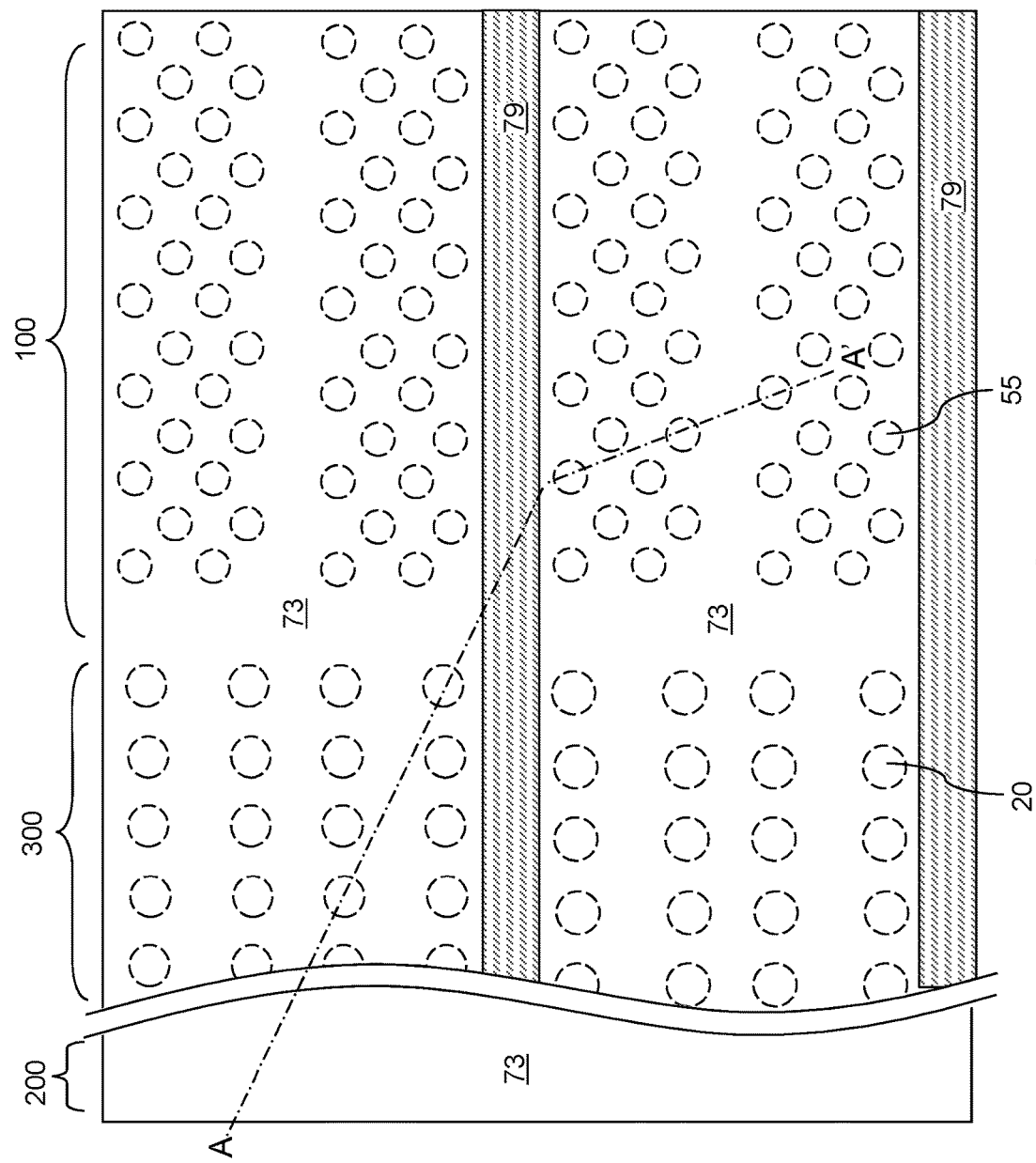
FIG. 13B is a partial see-through top-down view of the exemplary structure of FIG. 13A. The vertical plane A-A' is the plane of the schematic vertical cross-sectional view of FIG. 13A.

Referring to FIGS. 13A and 13B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 14:
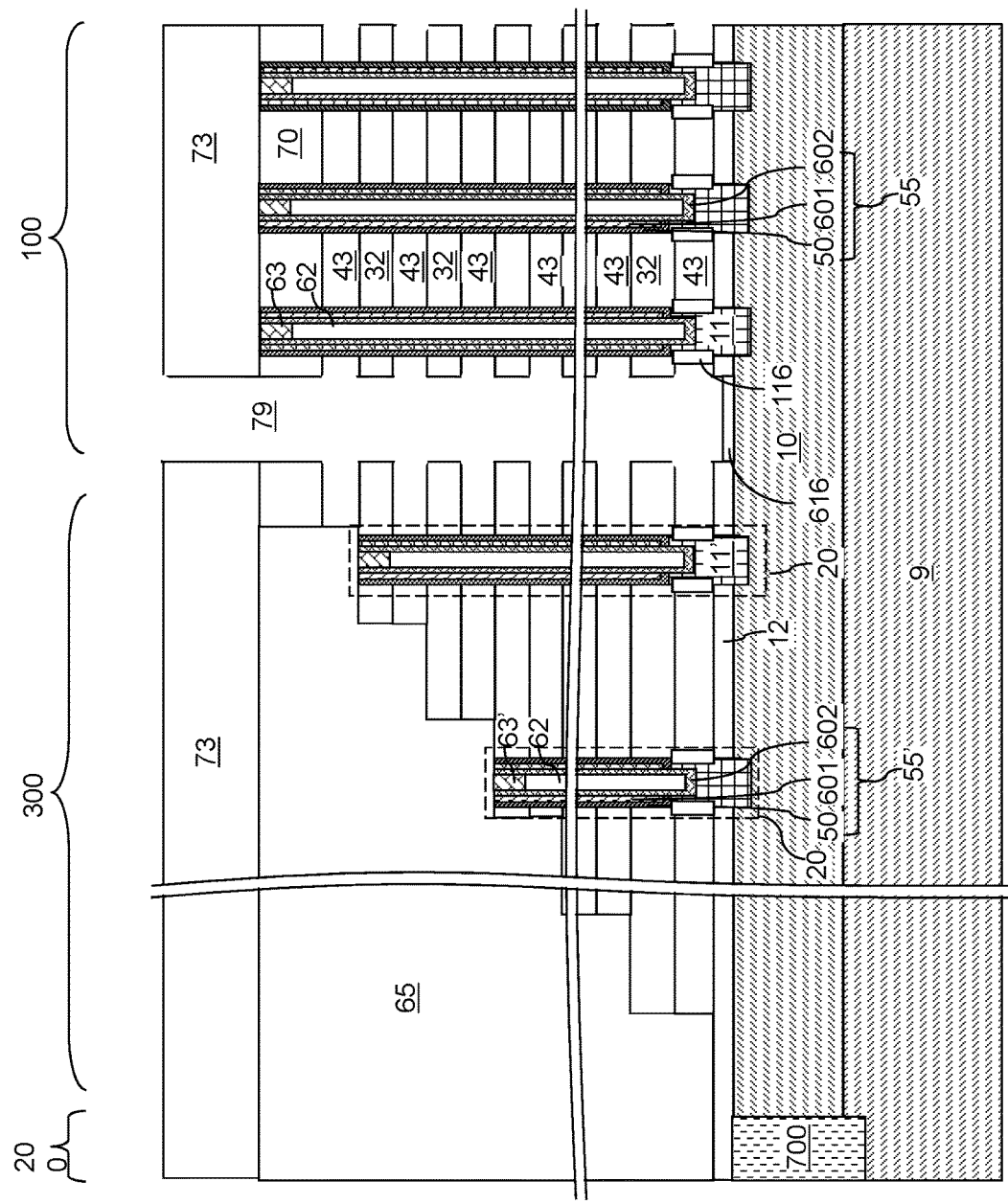
FIG. 14 is a schematic vertical cross-sectional view of the exemplary structure after formation of backside recesses according to an embodiment of the present disclosure.

Referring to FIGS. 14 and 15A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 15B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 15C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIG. 15D, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 16:
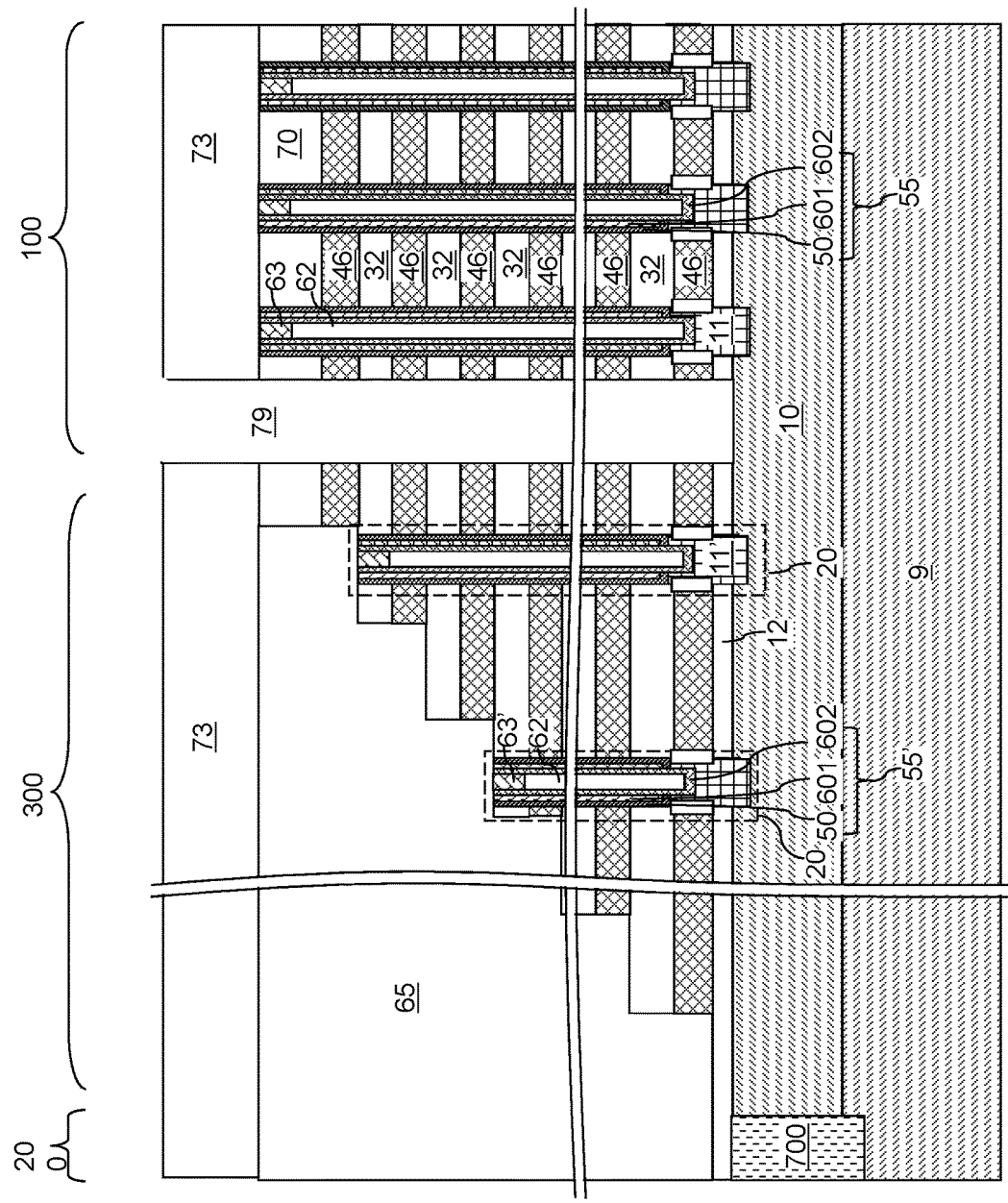
FIG. 16 is a schematic vertical cross-sectional view of the exemplary structure after removal of a deposited conductive material from within the backside trench according to an embodiment of the present disclosure.

Referring to FIG. 16, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46. The planar dielectric portion 616 can be removed after removal of the continuous electrically conductive material layer 46L by an isotropic etch or an anisotropic etch.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. The gate dielectric layer 12 can be vertically spaced from the backside trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside trench 79 depending on whether the gate dielectric layer 12 is not removed or partially removed during removal of the continuous electrically conductive material layer 46L. A backside cavity 79' is present within each backside trench 79.

Figure 17:
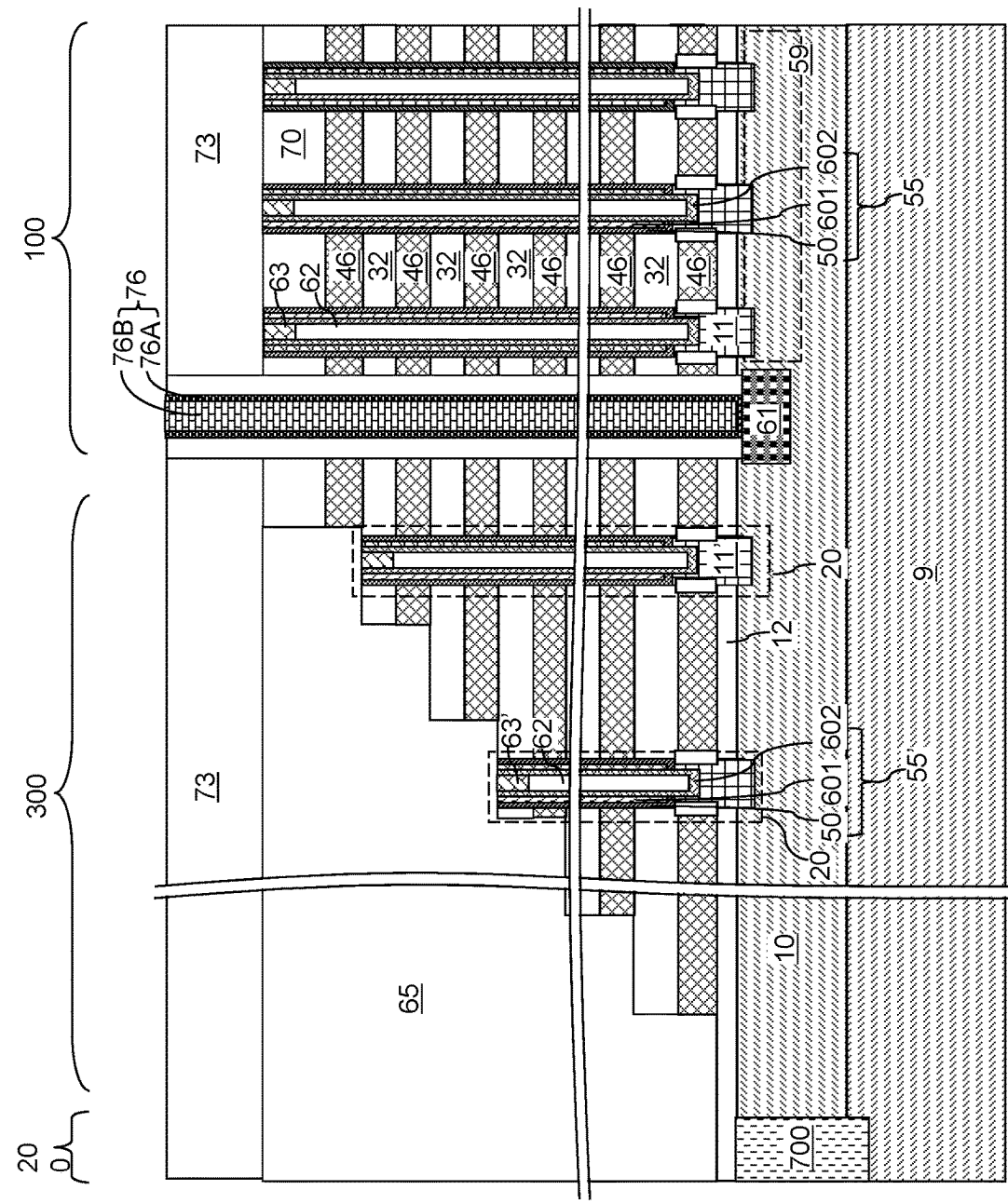
FIG. 17 is a schematic vertical cross-sectional view of the exemplary structure after formation of an insulating spacer and a backside contact structure according to an embodiment of the present disclosure.

Referring to FIG. 17, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 that underlies the opening through the insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 18A:
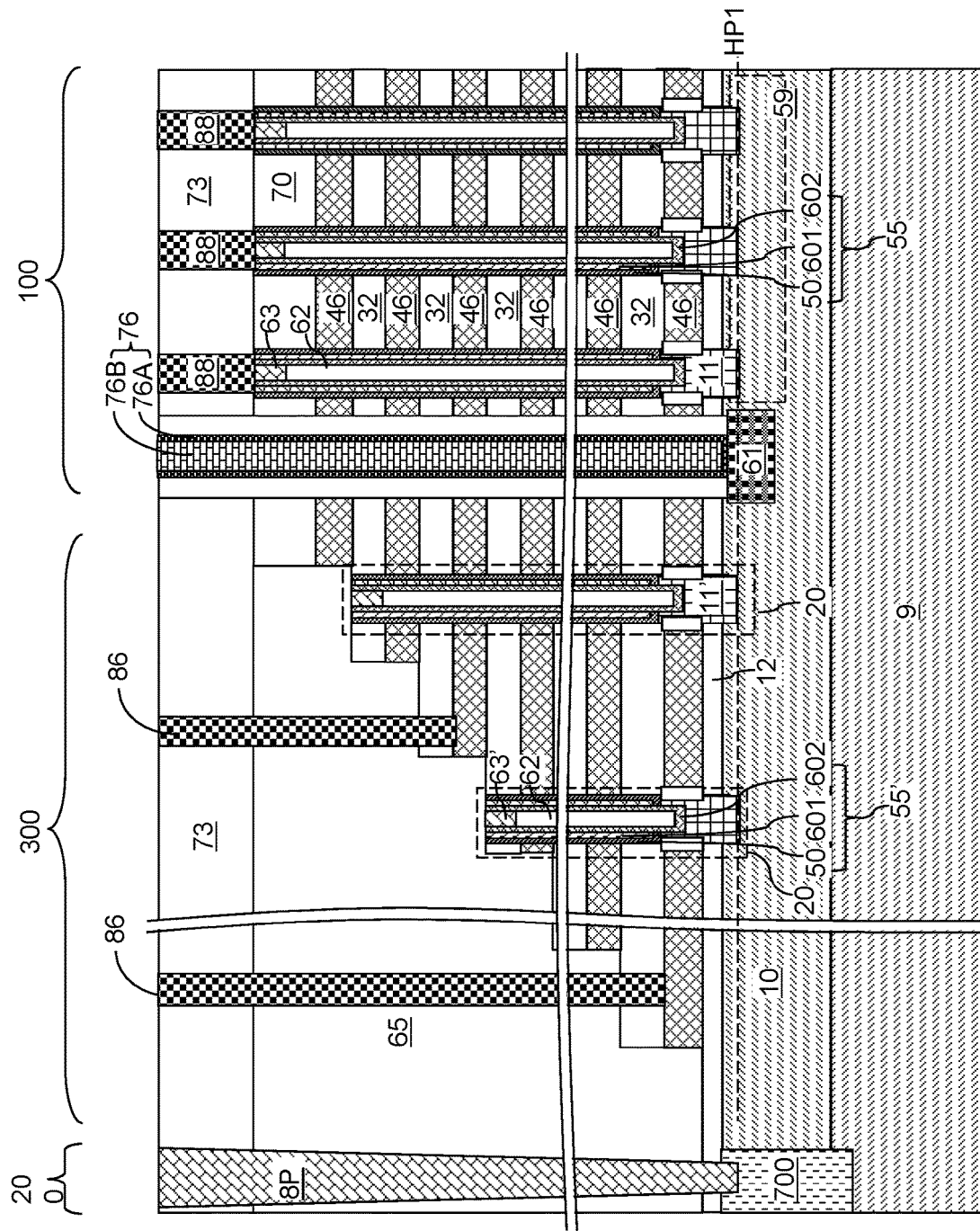
FIG. 18A is a schematic vertical cross-sectional view of the exemplary structure after formation of additional contact via structures according to an embodiment of the present disclosure.
Figure 18B:
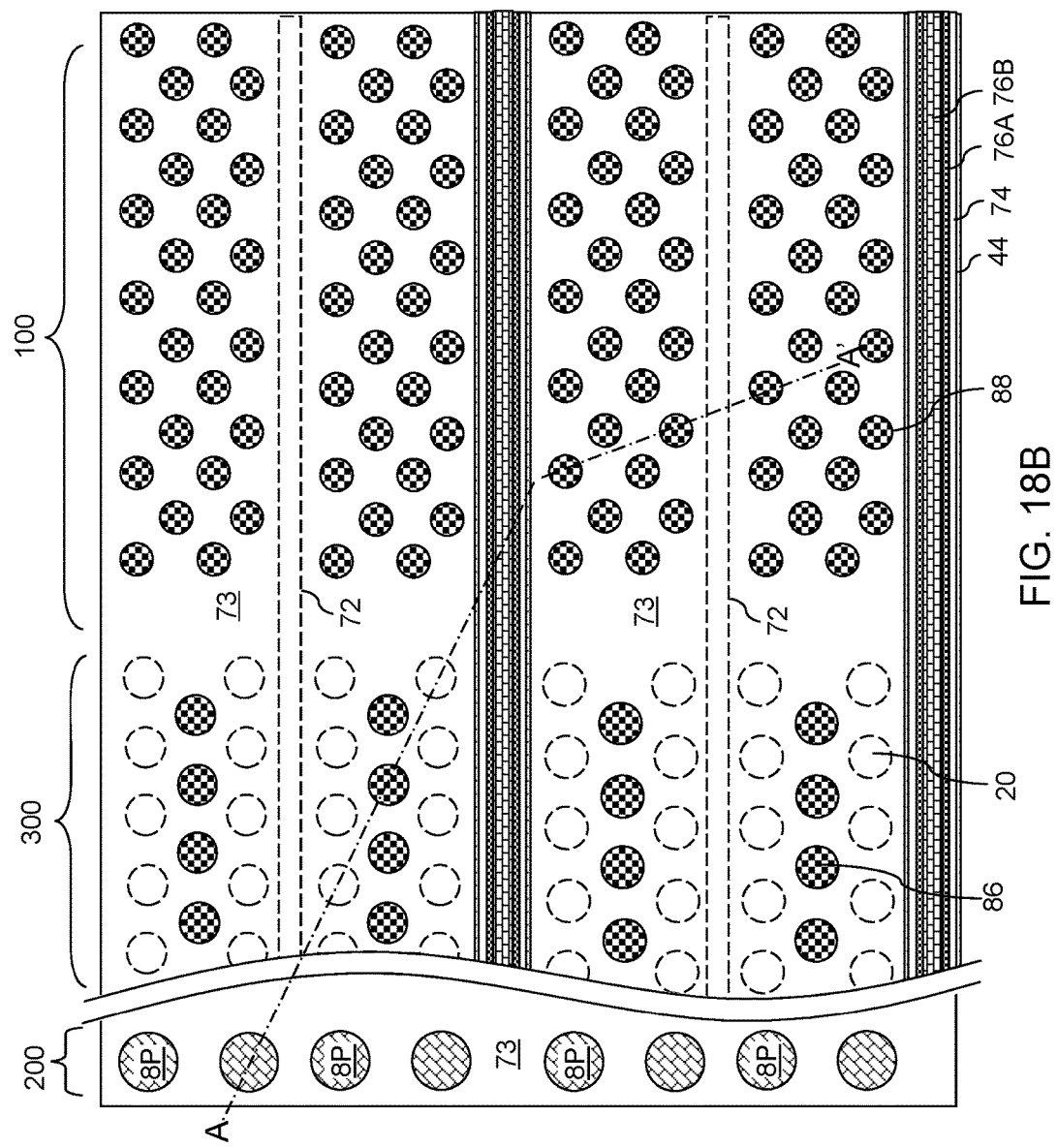
FIG. 18B is a top-down view of the exemplary structure of FIG. 18A. The vertical plane A-A' is the plane of the schematic vertical cross-sectional view of FIG. 18A.

Referring to FIGS. 18A and 18B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. The word line contact via structures 86 can be formed through the retro-stepped dielectric material portion 65 directly on top surfaces of the electrically conductive layers 46 in the terrace region (i.e., in the contact region 300). In one embodiment, top surfaces of the word line contact via structures 86 are formed in a horizontal plane located above topmost surfaces of the memory stack structures 55 such as the horizontal plane including the top surface of the contact level dielectric layer 73. Peripheral device contact via structures 8P can be formed through the retro-stepped dielectric material portion 65 directly on respective nodes of the peripheral devices.

The above described method of an embodiment of the present disclosure minimizes potential overlap in volume between the word line contact via structures 86 and the support pillar structures 20 by confining the volumes of the support pillar structures 20 underneath the retro-stepped dielectric material portion 65. Thus, overlay variations during lithographic patterning of via cavities for forming the word line contact via structures 86 are less likely to cause electrical shorts between the word line contact via structures 86 and the support pillar structures 20. In one embodiment, the areal density of the word line contact via structures 86 in a plan view (top-down view) can be increased compared to prior art structures, and a more compact three-dimensional memory device can be provided according to embodiments of the present disclosure.

The exemplary structure includes a three-dimensional memory device. The three-dimensional memory device can include: an alternating stack of insulating layers 32 and electrically conductive layers 46 located over a substrate (9, 10), wherein the alternating stack comprises a memory array region 100 in which each layer of the alternating stack (32, 46) is present and a terrace region in which each electrically conductive layer 46 other than a topmost electrically conductive layer within the alternating stack (32, 46) laterally extends farther than any overlying electrically conductive layer within the alternating stack (32, 46); memory stack structures 55 extending through the memory array region 100 of the alternating stack (32, 46), wherein each of the memory stack structures 55 comprises a respective memory film 50 and a respective vertical semiconductor channel 60 contacting an inner sidewall of the respective memory film 50; and support pillar structures 20 extending through the terrace region of the alternating stack (32, 46). The support pillar structures 20 have different heights from each other.

In one embodiment at least some of the support pillar structures 20 have a respective topmost surface that is more proximal to a top surface of the substrate (9, 10) than topmost surfaces of the memory stack structures 55 are to the top surface of the substrate (9, 10). In one embodiment, the respective topmost surface of each of the support pillar structures 20 is coplanar with a top surface of a respective one of the insulating layers 32. An insulating cap layer 70 can overlie the alternating stack (32, 46), and the topmost surface of the memory stack structures 55 can be coplanar with a top surface of the insulating cap layer 70.

In one embodiment, bottommost surfaces of the support pillar structures 20 and bottommost surfaces of the memory opening fill structures (11, 55, 62, 63) can be within a first horizontal plane HP1 (shown in FIG. 18A), and topmost surfaces of the support pillar structures 20 can be within a respective one of multiple horizontal planes, which can be horizontal planes including top surfaces of the insulating layers 32.

In one embodiment, the terrace region includes stepped surfaces of the alternating stack (32, 46) that continuously extend from a bottommost layer within the alternating stack (32, 46) to a topmost layer within the alternating stack (32, 46), and a retro-stepped dielectric material portion 65 contacts the stepped surfaces and overlies, and contacts, the support pillar structures 20. In one embodiment, topmost surfaces of the support pillar structures 20 contact a respective one of multiple horizontal bottom surfaces of the retro-stepped dielectric material portion 65. In one embodiment, bottom surfaces of the retro-stepped dielectric material portion 65 contact topmost surfaces of the support pillar structures 20 and top surfaces of the insulating layers 32 such that the support pillar structures 20 do not extend into the retro-stepped dielectric material portion 65. The electrically conductive layers 46 may comprise word lines of the memory device and word line contact via structures 86 extend through the retro-stepped dielectric material portion 65 and contact the top surfaces of the word lines 46 in the terrace region (i.e., the contact region 300).

In one embodiment, each of the support pillar structures 20 comprises a dummy memory film 50' that is identical to the memory films 50 of the memory stack structures 55 in material composition, and a dummy vertical semiconductor channel 60' that is identical to the vertical semiconductor channels 60 in material composition. In one embodiment, a top end of each vertical semiconductor channel 60 contacts a respective drain region 63, and a top end of each dummy vertical semiconductor channel 60' contacts a respective dummy drain region 63' having a same composition as the drain regions 60. In one embodiment, each of the memory stack structures 55 contacts a respective underlying pedestal channel portion 11, and each of the support pillar structures 20 comprises a respective dummy pedestal channel portion 11' that underlies a respective dummy memory film 50' and having a same composition as the pedestal channel portions 11.

The support pillar structures 20 have different heights. In one embodiment, the total number of the different heights of the support pillar structures 20 may be up to the total number of the insulating layers 32 in the alternating stack (32, 46), and may be at least one half of the total number of the insulating layers in the alternating stack (32, 46).

In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers located over a substrate, wherein the alternating stack comprises a memory array region and a terrace region;
   memory stack structures extending through the memory array region of the alternating stack, wherein each of the memory stack structures comprises a respective memory film and a respective vertical semiconductor channel contacting an inner sidewall of the respective memory film; and
   support pillar structures extending through the terrace region of the alternating stack,
   wherein the support pillar structures have different heights from each other;
   wherein each of the support pillar structures has a respective topmost surface that is coplanar with a top surface of a respective one of the insulating layers in the alternating stack; and
   wherein each of the support pillar structures comprises a dummy vertical semiconductor channel that is identical to the vertical semiconductor channels in material composition.

2. The three-dimensional memory device of claim 1, wherein:
   each layer of the alternating stack is present in the memory array region;
   in the terrace region, each electrically conductive layer other than a topmost electrically conductive layer within the alternating stack laterally extends farther than any overlying electrically conductive layer within the alternating stack; and
   at least some of the support pillar structures has a respective topmost surface that is more proximal to a top surface of the substrate than topmost surfaces of the memory stack structures are to the top surface of the substrate.

3. The three-dimensional memory device of claim 2, further comprising an insulating cap layer overlying the alternating stack, wherein the topmost surface of the memory stack structures are coplanar with a top surface of the insulating cap layer.

4. The three-dimensional memory device of claim 1, wherein:
   bottommost surfaces of the support pillar structures are within a first horizontal plane; and
   topmost surfaces of the support pillar structures are within a respective one of multiple horizontal planes.

5. The three-dimensional memory device of claim 1, wherein:
   the electrically conductive layers comprise word lines;
   the terrace region includes stepped surfaces of the alternating stack that continuously extend from a bottommost layer within the alternating stack to a topmost layer within the alternating stack; and a retro-stepped dielectric material portion contacts the stepped surfaces and overlies the support pillar structures.

6. The three-dimensional memory device of claim 5, wherein:

topmost surfaces of the support pillar structures contact a respective one of multiple horizontal bottom surfaces of the retro-stepped dielectric material portion; and bottom surfaces of the retro-stepped dielectric material portion contact topmost surfaces of the support pillar structures and top surfaces of the insulating layers such that the support pillar structures do not extend into the retro-stepped dielectric material portion.

7. The three-dimensional memory device of claim 5, further comprising word line contact via structures which extend through the retro-stepped dielectric material portion and contact top surfaces of the word lines in the terrace region.

8. The three-dimensional memory device of claim 1, wherein each of the support pillar structures comprises a dummy memory film that is identical to the memory films of the memory stack structures in material composition.

9. The three-dimensional memory device of claim 8, wherein:

a top end of each vertical semiconductor channel contacts a respective drain region; and a top end of each dummy vertical semiconductor channel contacts a respective dummy drain region having a same composition as the drain regions.

10. The three-dimensional memory device of claim 9, wherein:

each top surface of the drain regions is contacted by a bottom surface of a respective drain contact via structure; and each top surface of the dummy drain regions is contacted by a retro-stepped dielectric material portion.

11. The three-dimensional memory device of claim 8, wherein:

each of the memory stack structures contacts a respective underlying pedestal channel portion; and each of the support pillar structures comprises a respective dummy pedestal channel portion that underlies a respective dummy memory film and having a same composition as the pedestal channel portions.

12. The three-dimensional memory device of claim 11, wherein each of the underlying pedestal channel portion and each of the underlying dummy pedestal channel portion comprise a single crystalline semiconductor material in epitaxial alignment with a single crystalline semiconductor material of a semiconductor material layer located in the substrate.

13. The three-dimensional memory device of claim 12, wherein:

each of the underlying pedestal channel portion and each of the underlying dummy pedestal channel portion are laterally surrounded by a respective tubular dielectric spacer; and each of the tubular dielectric spacers is laterally surrounded by a bottommost one of the electrically conductive layers.

14. The three-dimensional memory device of claim 1, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

15. The three-dimensional memory device of claim 1, wherein:

top surfaces of the memory stack structures are located above a horizontal plane including a top surface of a topmost one of the electrically conductive layers; and each top surface of the support pillar structures is located below the horizontal plane including the top surface of the topmost one of the electrically conductive layers.

16. The three-dimensional memory device of claim 1, further comprising a retro-stepped dielectric material portion contacting each top surface of the support pillar structures.

17. The three-dimensional memory device of claim 16, wherein a top surface of the retro-stepped dielectric material portion is located within a same horizontal plane as top surfaces of the memory stack structures.

18. The three-dimensional memory device of claim 16, wherein each of the dummy vertical semiconductor channels contacts a respective horizontal surface of the retro-stepped dielectric material portion.

19. The three-dimensional memory device of claim 16, wherein the retro-stepped dielectric material portion contacts a sidewall of each of the insulating layers in the alternating stack.

20. The three-dimensional memory device of claim 16, wherein an entire top surface of each of the support pillar structures contacts a respective horizontal bottom surface of the retro-stepped dielectric material portion.

21. The three-dimensional memory device of claim 16, wherein each dummy vertical semiconductor channel has an annular top surface that contacts a respective horizontal bottom surface of the retro-stepped dielectric material portion.

22. The three-dimensional memory device of claim 1, wherein each of the support pillar structures vertically extends through a bottommost one of the electrically conductive layers and does not extend through a topmost one of the electrically conductive layers.

* * * * *